(12) United States Patent
Eom et al.

(10) Patent No.: US 11,188,164 B2
(45) Date of Patent: Nov. 30, 2021

(54) DISPLAY DEVICE

(71) Applicant: Samsung Display Co., Ltd., Yongin-si (KR)

(72) Inventors: Cheol Hwan Eom, Asan-si (KR); Min Young Song, Asan-si (KR); Sang Min Kang, Hwaseong-si (KR); Young Eun Nam, Suncheon-si (KR); Hyea Weon Shin, Seongnam-si (KR); Chul Woo Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/741,687

(22) Filed: Jan. 13, 2020

(65) Prior Publication Data

US 2020/0285338 A1    Sep. 10, 2020

(30) Foreign Application Priority Data

Mar. 5, 2019 (KR) ........................ 10-2019-0025176

(51) Int. Cl.
*G06F 3/041* (2006.01)

(52) U.S. Cl.
CPC .. *G06F 3/0412* (2013.01); *G06F 2203/04102* (2013.01); *G06F 2203/04103* (2013.01)

(58) Field of Classification Search
CPC ......... G06F 3/0412; G06F 2203/04103; G06F 2203/04102; G06F 3/0445; G06F 3/0446; G06F 3/04164; H01L 51/5281; H01L 27/323; G02F 1/13338; H05K 1/118
See application file for complete search history.

(56) References Cited

U.S. PATENT DOCUMENTS

| | | | | |
|---|---|---|---|---|
| 7,593,085 | B2 * | 9/2009 | Watanabe | G02F 1/13452 349/149 |
| 9,287,329 | B1 * | 3/2016 | Lee | H01L 51/5262 |
| 10,481,726 | B2 | 11/2019 | Ahn | |
| 2014/0167010 | A1 * | 6/2014 | Jung | H01L 51/5246 257/40 |

(Continued)

FOREIGN PATENT DOCUMENTS

| KR | 10-2015-0047800 | 5/2015 |
|---|---|---|
| KR | 10-2016-0061563 | 6/2016 |

(Continued)

*Primary Examiner* — Grant Sitta
(74) *Attorney, Agent, or Firm* — H.C. Park & Associates, PLC

(57) ABSTRACT

A display device includes a touch panel (TP), a transparent adhesive member (TAM) on a surface of the TP, a touch printed circuit board (TPCB), and a display panel (DP) on a surface of the TAM. The TP includes a sensing portion and a pad side portion (PSP) on a side of the sensing portion. The TPCB includes a contact portion (CP) attached to a surface of the PSP. The DP includes a substrate, an optical film (OF) on a surface of the substrate, and a bending protection layer (BPL) on a side of the OF on the surface of the substrate. The surface of the PSP includes a connection area attached to the CP and a non-connection area not attached to the CP. The OF is spaced from the BPL with a gap disposed therebetween. The TAM overlaps, in a thickness direction, with the TPCB and the gap.

20 Claims, 15 Drawing Sheets

(56) References Cited

U.S. PATENT DOCUMENTS

| | | | |
|---|---|---|---|
| 2015/0309636 A1* | 10/2015 | Kurasawa | G06F 3/0446 345/173 |
| 2016/0147361 A1* | 5/2016 | Ahn | G09G 3/20 345/173 |
| 2016/0172623 A1* | 6/2016 | Lee | H01L 27/3276 257/40 |
| 2016/0179229 A1* | 6/2016 | Ahn | G06F 3/04164 345/173 |
| 2017/0177108 A1* | 6/2017 | Sebastian | H05K 3/28 |
| 2017/0271616 A1* | 9/2017 | Choi | H01L 51/5253 |
| 2017/0287814 A1* | 10/2017 | Kim | H01L 23/29 |
| 2018/0006004 A1* | 1/2018 | Namkung | H01L 27/3276 |
| 2018/0341290 A1 | 11/2018 | Sim et al. | |
| 2019/0340959 A1* | 11/2019 | Park | H01L 51/0097 |
| 2020/0022261 A1* | 1/2020 | Choi | G06F 3/0412 |
| 2020/0026391 A1* | 1/2020 | Tomokawa | G06F 3/0445 |

FOREIGN PATENT DOCUMENTS

| | | |
|---|---|---|
| KR | 10-2018-0127164 | 11/2018 |
| KR | 10-1918003 | 11/2018 |
| KR | 10-2018-0130151 | 12/2018 |

\* cited by examiner

FIG.7
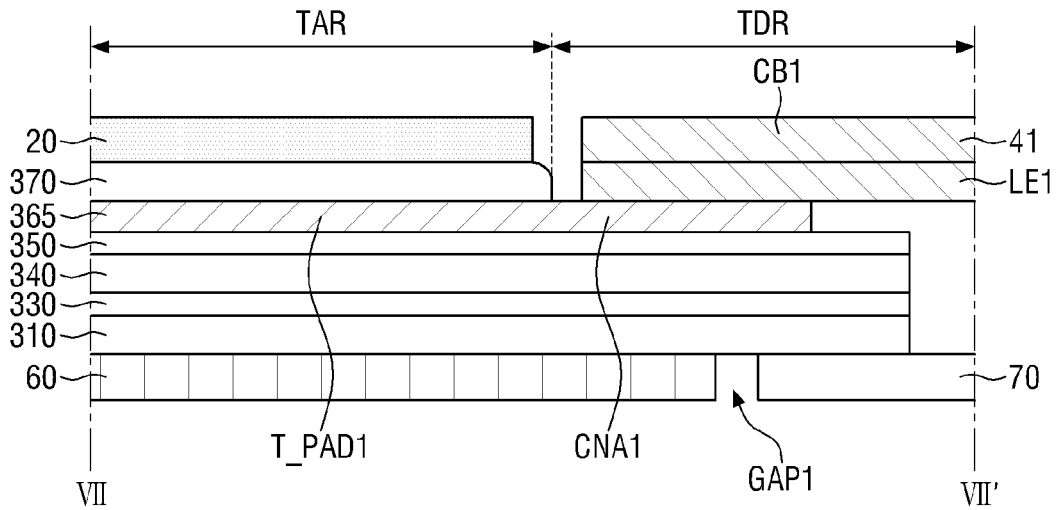
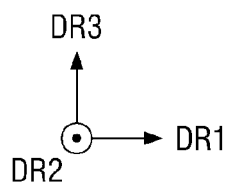
FIG. 8
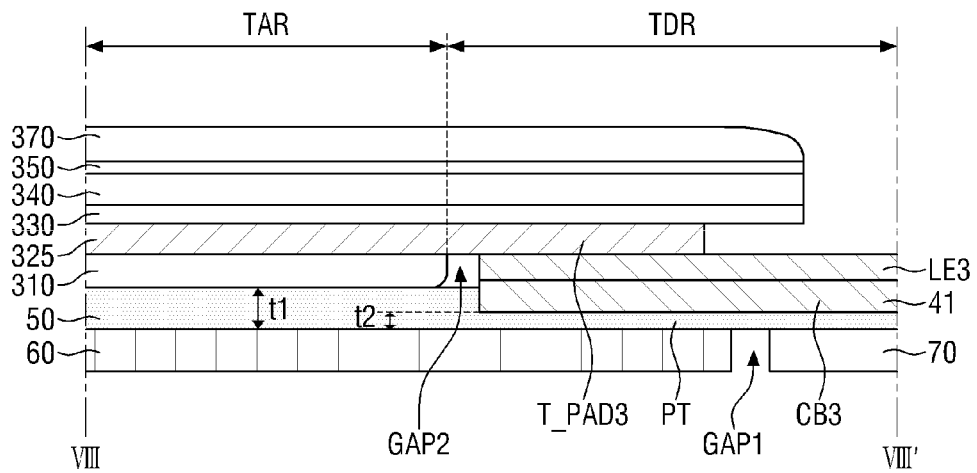
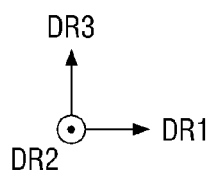

FIG. 14
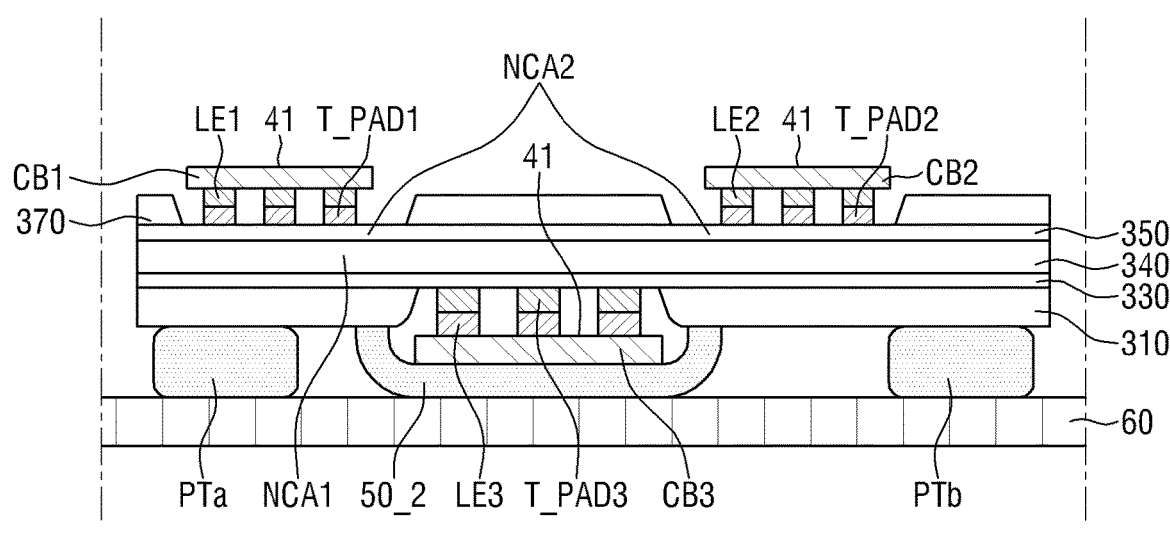
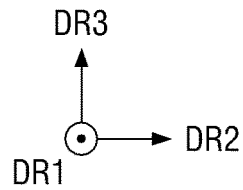

DISPLAY DEVICE

CROSS-REFERENCE TO RELATED APPLICATION

This application claims priority to and the benefit of Korean Patent Application No. 10-2019-0025176, filed Mar. 5, 2019, which is hereby incorporated by reference for all purposes as if fully set forth herein.

BACKGROUND

Field

Exemplary embodiments generally relate to a display device, and, more particularly, to a display device including a plurality of members attached thereto via adhesive members.

Discussion

Display devices are for displaying images and include a display panel, such as an organic light-emitting display panel or a liquid-crystal display panel. Such a display device may include a window for protecting the display panel from an external shock. The window may be frequently employed by portable electronic devices, such as smart phones. Some portable electronic devices provide a touch input feature. Such a display device may include a touch panel to perform the touch input feature. The window, the touch panel, and the display panel may be attached to one another by an adhesive. The touch panel and the display panel may receive an external signal through a printed circuit film or the like attached to corresponding connection portions.

The display panel may include a polarizing film and a bending protection layer spaced apart from the polarizing film. The polarizing film typically contains ions that give metal an impetus to corrode, such as iodine ions. Lines disposed at the corresponding connection portions of the touch panel may corrode due to ions, such as iodine ions.

The above information disclosed in this section is only for understanding the background of the inventive concepts, and, therefore, may contain information that does not form prior art.

SUMMARY

Some exemplary embodiments provide a display device capable of preventing (or at least reducing) signal lines disposed on connection portions of a touch panel and lead lines on a touch printed circuit board connected to the signal lines from corroding.

Additional aspects will be set forth in the detailed description which follows, and, in part, will be apparent from the disclosure, or may be learned by practice of the inventive concepts.

According to some exemplary embodiments, a display device includes a touch panel, a transparent adhesive member, a touch printed circuit board, and a display panel. The touch panel includes a sensing portion and a pad side portion disposed on a side of the sensing portion. The transparent adhesive member is disposed on a surface of the touch panel. The touch printed circuit board includes a contact portion attached to a surface of the pad side portion. The display panel disposed on a surface of the transparent adhesive member. The display panel includes a display substrate, an optical film disposed on a surface of the display substrate, and a bending protection layer disposed on a side of the optical film on the surface of the display substrate. The surface of the pad side portion includes a connection area attached to the contact portion and a non-connection area not attached to the contact portion. The optical film is spaced apart from the bending protection layer such that a gap is disposed between the optical film and the bending protection layer. The transparent adhesive member overlaps, in a thickness direction, with the touch printed circuit board and the gap.

According to some exemplary embodiments, a display device includes a touch panel, a first transparent adhesive member, a printed circuit board, a display panel, a second transparent adhesive member, and a window. The touch panel includes a pad side portion. The first transparent adhesive member is disposed on a first surface of the touch panel. The printed circuit board includes a first contact portion attached to a surface of the pad side portion. The display panel is disposed on a surface of the first transparent adhesive member. The display panel includes a display substrate, an optical film disposed on a surface of the display substrate, and a bending protection layer disposed on a side of the optical film on the surface of the display substrate. The second transparent adhesive member is disposed on a second surface of the touch panel. The second surface opposes the first surface. The window is disposed on the second transparent adhesive member. The surface of the pad side portion includes a first connection area attached to the first contact portion, and a first non-connection area not attached to the first contact portion. The optical film is spaced apart from the bending protection layer such that a gap is disposed between the optical film and the bending protection layer. The first transparent adhesive member partially overlaps, in a thickness direction, with the optical film, the bending protection layer, and the printed circuit board. A side surface of the second transparent adhesive member on the first connection area protrudes beyond a side surface of the first transparent adhesive member.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIG. 7 is a cross-sectional view taken along sectional line VII-VII' of FIG. 3 according to some exemplary embodiments.

FIG. 8 is a cross-sectional view taken along sectional line VIII-VIII' of FIG. 3 according to some exemplary embodiments.

FIG. 14 is a cross-sectional view of FIG. 13 according to some exemplary embodiments.

DETAILED DESCRIPTION OF THE ILLUSTRATED EMBODIMENTS

Figure 1:
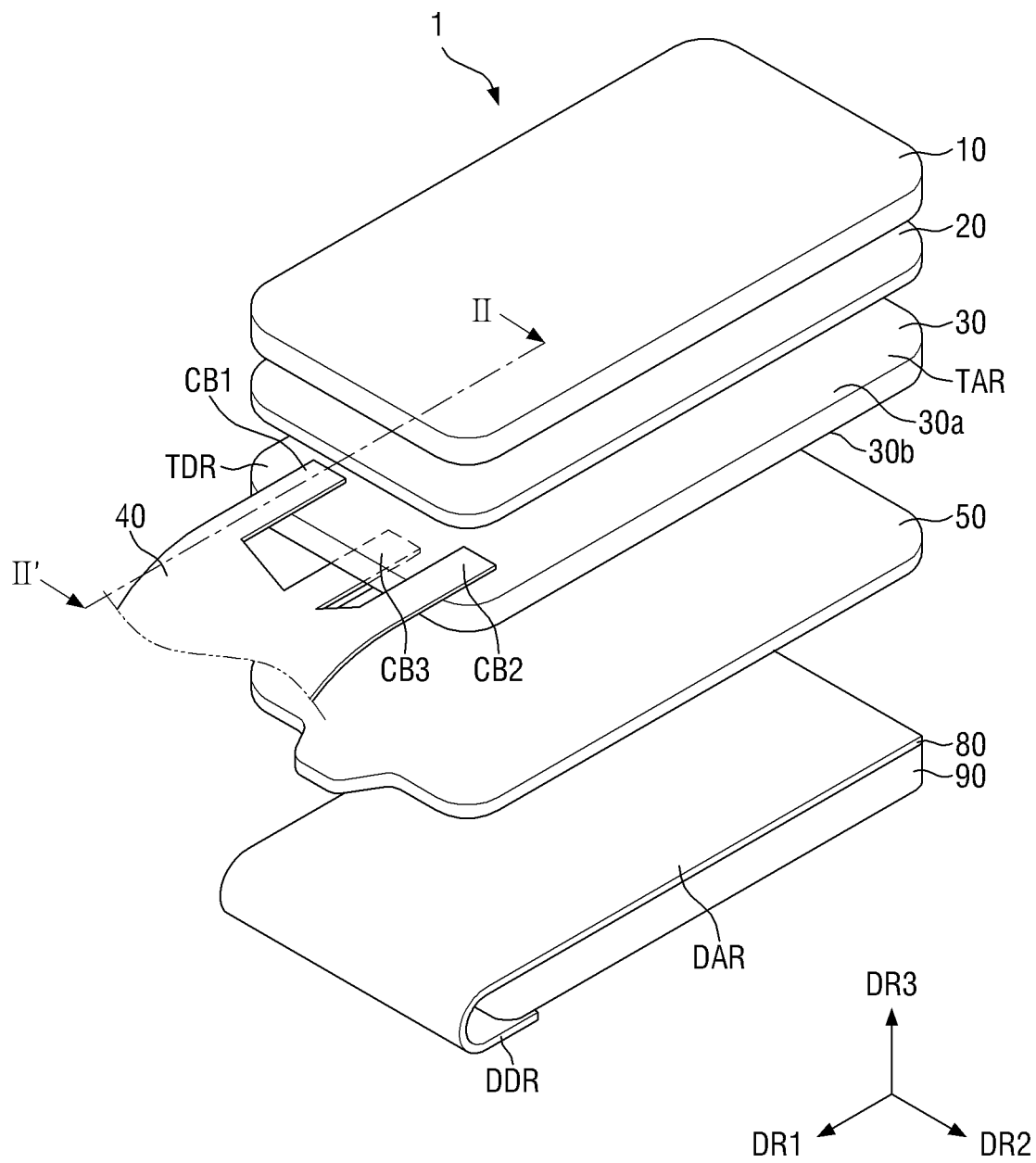
FIG. 1 is an exploded, perspective view of a display device according to some exemplary embodiments.

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalties between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

According to various exemplary embodiments, a display device may include a plurality of members to be attached thereto via adhesive members. The plurality of members may include panels and/or a window. The panel may include a display panel, a touch panel, etc. The adhesive member may be optically transparent.

Hereinafter, various exemplary embodiments will be explained in detail with reference to the accompanying drawings.

Figure 2:
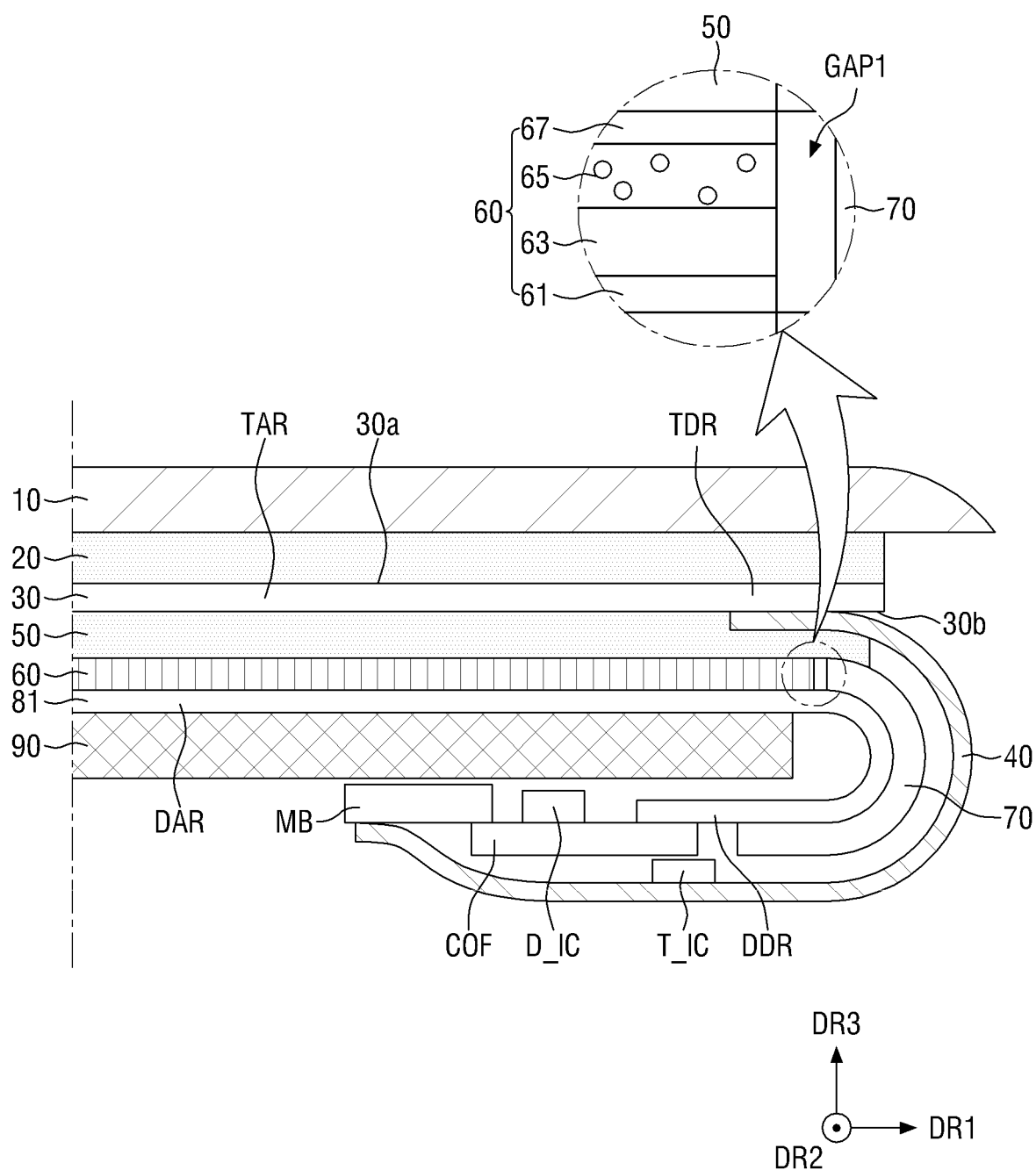
FIG. 2 is a cross-sectional view taken along sectional line II-II' of FIG. 1 according to some exemplary embodiments.
Figure 3:
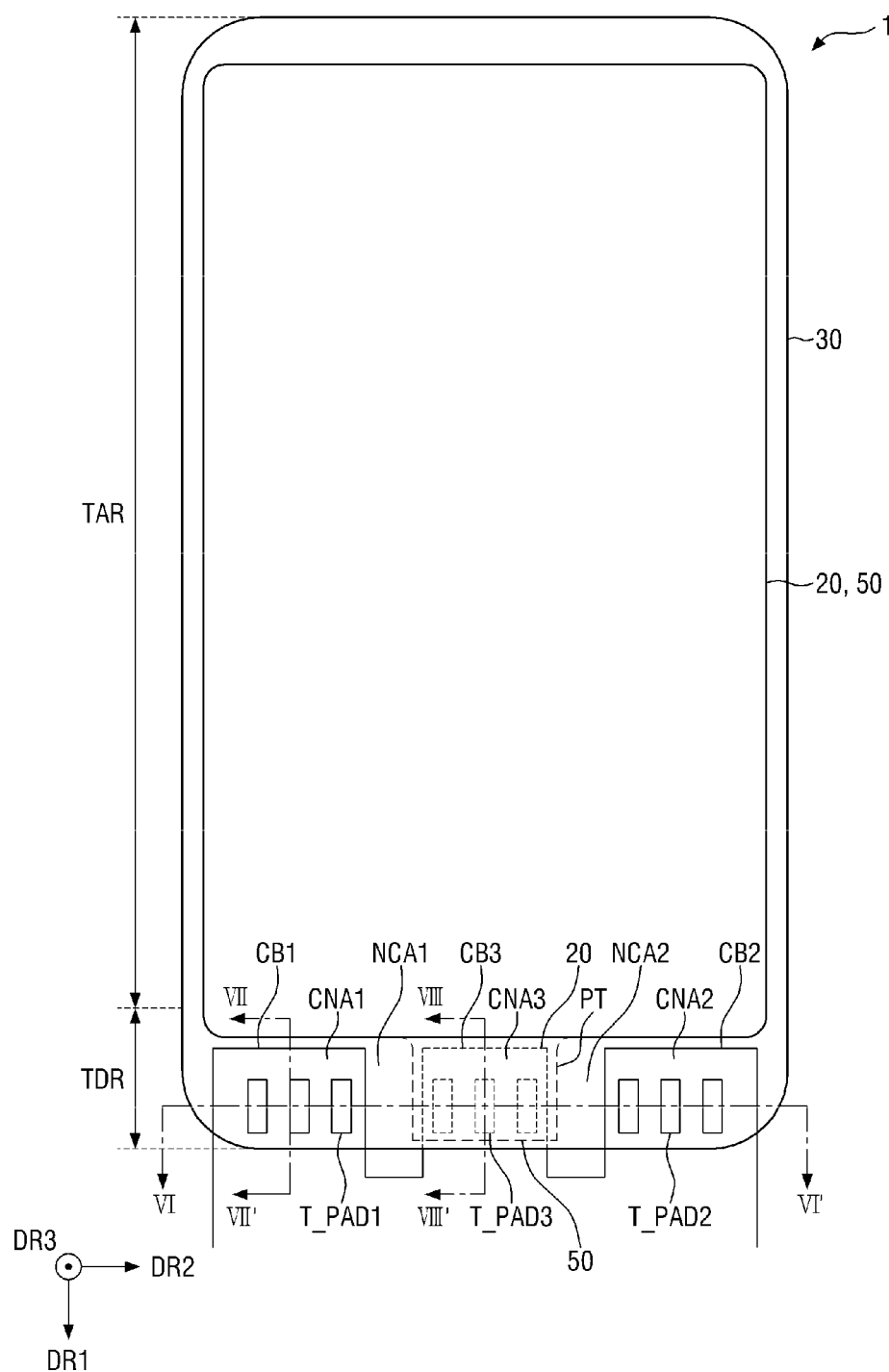
FIG. 3 is a top plan view showing the layout of a touch panel and first and second transparent adhesive members according to some exemplary embodiments.
Figure 4:
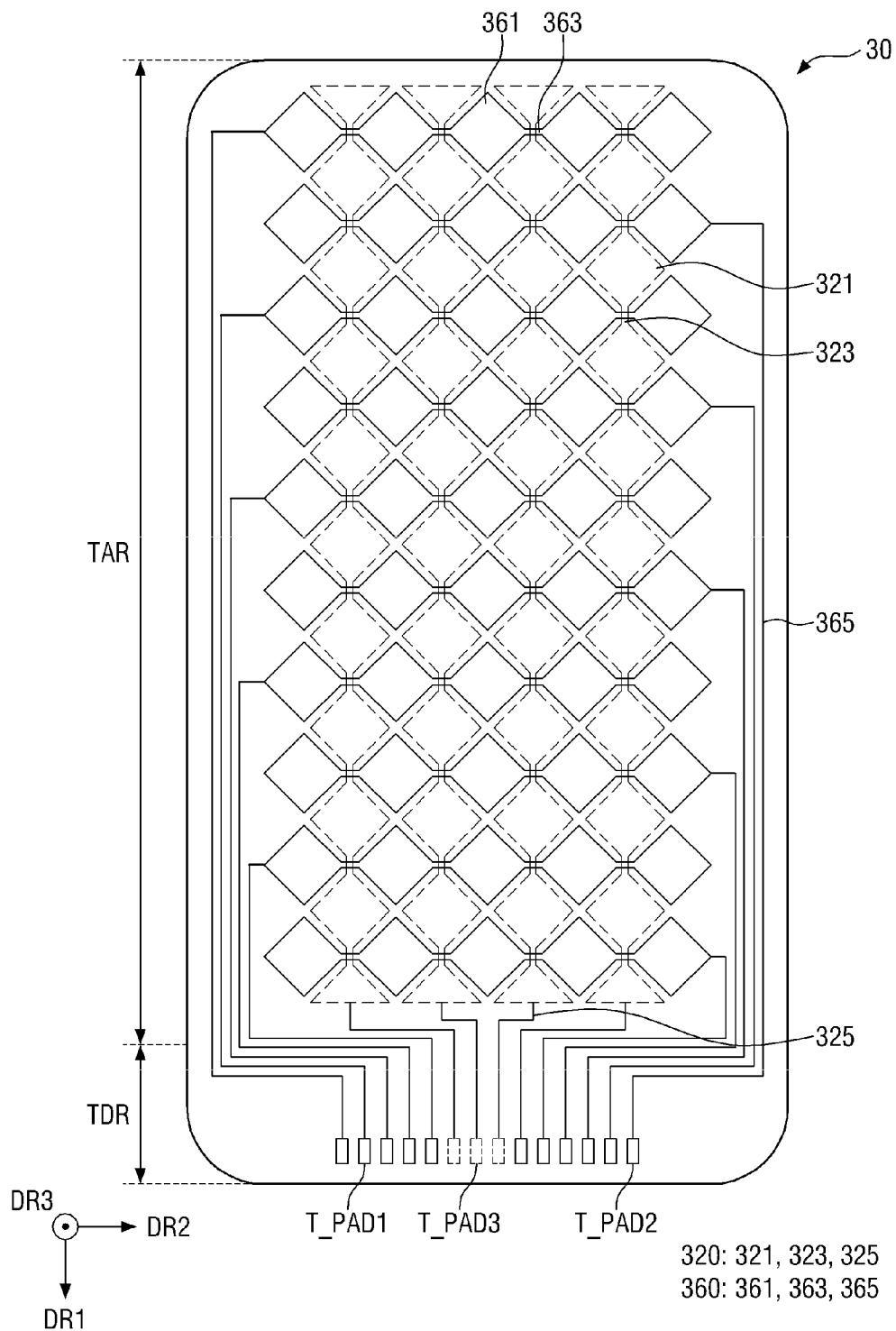
FIG. 4 is a plan view of a touch panel according to some exemplary embodiments.
Figure 5:
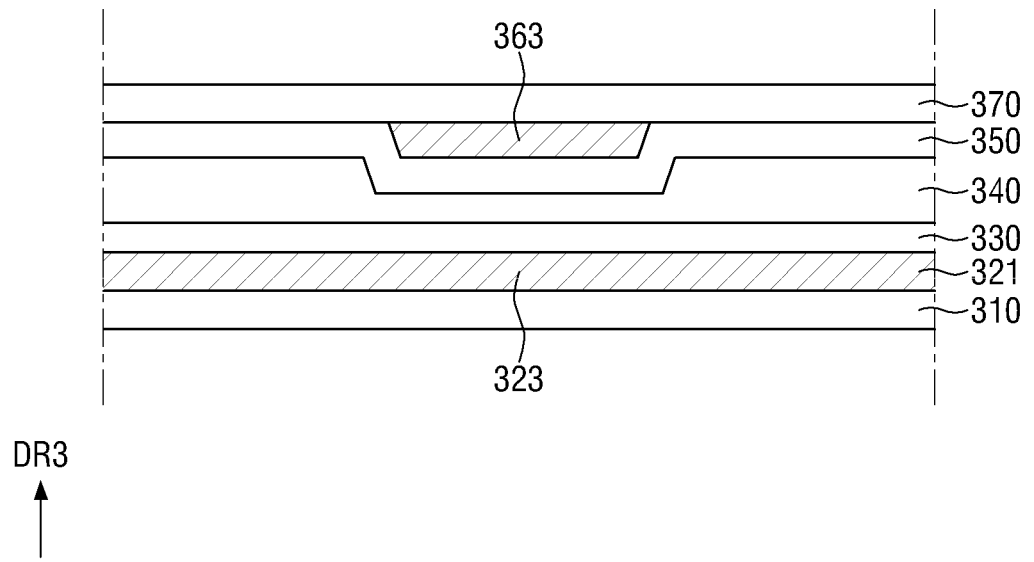
FIG. 5 is a cross-sectional view of a touch panel according to some exemplary embodiments.
Figure 6:
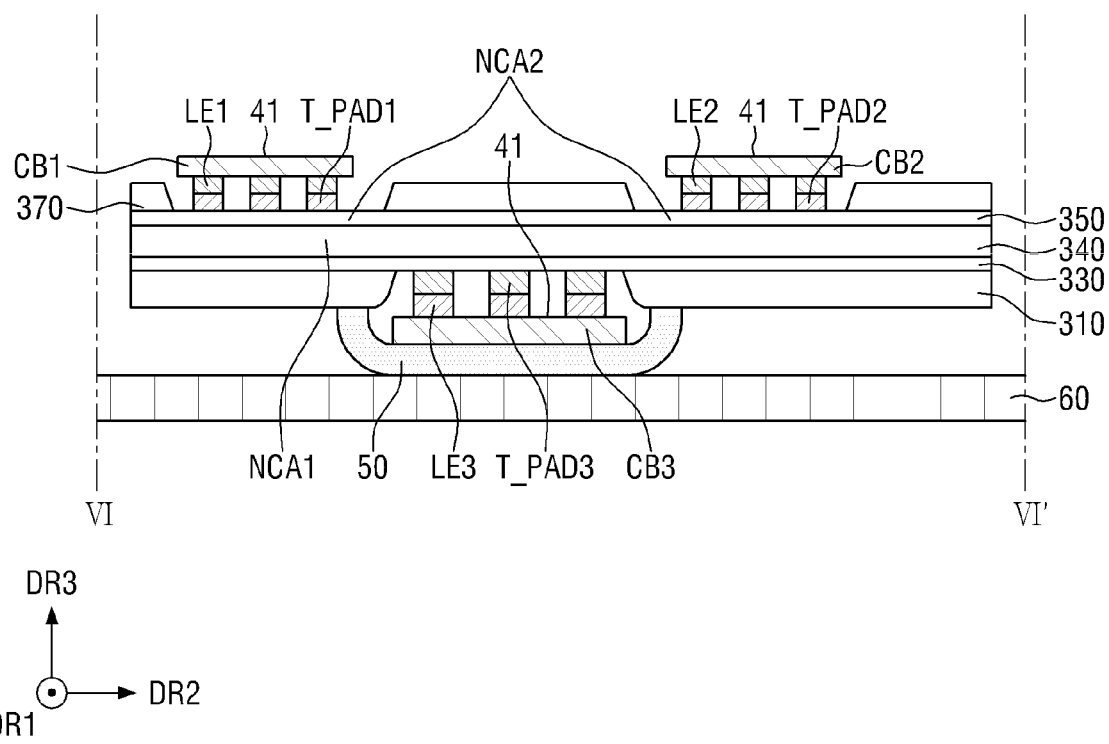
FIG. 6 is a cross-sectional view taken along sectional line VI-VI' of FIG. 3 according to some exemplary embodiments.

FIG. 1 is an exploded, perspective view of a display device according to some exemplary embodiments. FIG. 2 is a cross-sectional view taken along sectional line II-II' of FIG. 1 according to some exemplary embodiments. FIG. 3 is a top plan view showing the layout of a touch panel and first and second transparent adhesive members according to some exemplary embodiments. FIG. 4 is a plan view of a touch panel according to some exemplary embodiments. FIG. 5 is a cross-sectional view of a touch panel according to some exemplary embodiments. FIG. 6 is a cross-sectional view taken along sectional line VI-VI' of FIG. 3 according to some exemplary embodiments. FIG. 7 is a cross-sectional view taken along sectional line VII-VII' of FIG. 3 according to some exemplary embodiments. FIG. 8 is a cross-sectional view taken along sectional line VIII-VIII' of FIG. 3 according to some exemplary embodiments.

Referring to FIGS. 1 to 8, a display device 1 includes a display panel 80, a touch panel 30, a window 10, a first transparent adhesive member 50, and a second transparent adhesive member 20. The display panel 80 is a panel for displaying an image by receiving a data signal. At least one of an organic light-emitting display panel, a liquid-crystal display panel, a plasma display panel, and an electrophoretic display panel may be employed as the display panel 80. For descriptive and illustrative purposes, an organic light-emitting display panel will be described as the display panel 80.

The display panel 80 may include a display area DAR and a driving area DDR.

The display area DAR includes a plurality of pixels. Each of the pixels may include an emissive layer and a circuit layer for controlling the amount of light emitted from the emissive layer. The circuit layer may include display lines, display electrodes, and at least one transistor. The emissive layer may include an organic light-emitting material. The emissive layer may be sealed by an encapsulation layer. The encapsulation layer can seal the emissive layer to prevent (or at least reduce) moisture and the like from being introduced from the outside. The encapsulation layer may be made up of a single inorganic layer or multiple layers thereof, or a stack of inorganic layers and organic layers alternately stacked on one another.

The display area DAR may further include an optical film 60 disposed on the encapsulation layer. The optical film 60 may be disposed in the display area DAR and not in the driving area DDR disposed on, for instance, one side of the display area DAR. Exemplary embodiments, however, are not limited thereto. The optical film 60 may be disposed on a part of the driving area DDR.

The optical film 60 may include a plurality of films stacked on one another as shown in FIG. 2. The optical film 60 may include a first optical protection film 61 disposed on the encapsulation layer, a phase retardation film 63 disposed on the first optical protection film 61, a polarizing film 65 disposed on the phase retardation film 63, and a second optical protection film 67 disposed on the polarizing film 65.

The first and second optical protection films 61 and 67 of the optical film 60 can protect the polarizing film 65 and the phase retardation film 63 of the optical film 60 from external moisture and foreign substances. The first and second optical protection films 61 and 67 may include an organic insulating material.

The phase retardation film 63 may change the phase of light. For example, the phase retardation film 63 may be a $\lambda/4$ phase retardation film. The phase retardation film 63 may be made up of a birefringent film including a polymer, an alignment film of a liquid crystal polymer, a film including an alignment layer of a liquid crystal polymer, etc.

The polarizing film 65 may selectively transmit light. For example, the polarizing film 65 may be a linear polarizing film. The polarizing film 65 may be a polyvinyl alcohol (PVA) film. The polarizing film 65 may be produced by stretching a polyvinyl alcohol film in a direction and then adsorbing iodine (I) or a dichroic dye onto (or into) it. The polarizing film 65 has an absorption axis in the direction that it is stretched and a transmission axis in the direction perpendicular to the absorption axis. Light is incident on the polarizing film 65, and only linearly polarized light exits in a direction parallel to the transmission axis. It is to be noted that the polarizing film 65 may further include corrosion promoting ions CPI that corrodes the touch signal line and the touch lead signal line, which will be described later.

The corrosion promoting ions CPI may be in the ionic form of iodine (I) described above. Corrosion promoting ions CPI of the polarizing film 65 can be eluted through the external moisture of the polarizing film 65. For example, the corrosion promoting ions CPI are not eluted from the top and bottom of the polarizing film 65 as it is covered by the first and second optical protection films 61 and 67, respectively. However, the corrosion promoting ions CPI may be eluted through external moisture from the side surfaces exposed by the first and second optical protection films 61 and 67. In this regard, in the display device 1 according to some exemplary embodiments, the first transparent adhesive member 50 disposed on the optical film 60 covers the touch signal lines and the touch lead signal lines so that it is possible to prevent corrosion of the lines on the connection portions. More detailed description thereon will be given later.

The display area DAR may have a rectangular shape or a rectangular shape with rounded corners. It, however, is contemplated that exemplary embodiments are not limited thereto. The display area DAR may have various shapes, such as a square or other polygonal or circular shape, elliptical shape, etc.

The driving area DDR is disposed around the display area DAR, for example, on one side thereof. The driving area DDR may be a non-display area where no image is displayed. Unlike the display area DAR, the driving area DDR may include no pixel. When the display area DAR has a rectangular shape with rounded corners, the driving area DDR is disposed adjacent to at least one side of the rectangular shape of the display area DAR. In the drawings, the driving area DDR is disposed adjacent to one shorter side of the display area DAR, for example. The driving area DDR may include a driving line connected to the display line of the pixel, and a pad of the driving line. External components, such as a driver chip and a printed circuit board, may be mounted on the driving line pads as will be described later.

In some exemplary embodiments, the display panel 80 may include a substrate 81. The substrate 81 may be a flexible substrate made of a flexible plastic material, such as polyimide. The circuit layer and the emissive layer of the display area DAR may be disposed on a surface of the substrate 81. When the substrate 81 has flexibility, the substrate 81 may be bent at the driving area DDR. For example, the substrate 81 of the driving area DDR disposed adjacent to the shorter side of the display area DAR may be bent away from the display surface to be extended to the rear surface of the display area DAR. The bent driving area DDR may partially overlap with the display area DAR. The bent surface of the substrate 81 may face the opposite side to the surface of the substrate 81 of the display area DAR. That is to say, the surface of the substrate 81 of the display area DAR may face the upper side, whereas the bent surface of the substrate 81 may face the lower side.

The driving line of the driving area DDR may be extended along the bending area, and the driving line pad may be disposed on the area where the display area DAR overlaps with the bent driving area DDR.

The driving area DDR of the display panel 80 may include a bending protection layer 70. The bending protection layer 70 may be disposed on one side of the optical film 60 and may be spaced apart from the optical film 60 with a first gap GAP1 therebetween. In FIG. 2, the optical film 60 and the bending protection layer 70 are disposed on the same layer. However, as described above, the optical film 60 may be disposed on the encapsulation layer of the display area DAR, and the bending protection layer 70 may not overlap with the encapsulation layer so that the optical film 60 and the bending protection layer 70 may not be disposed on the same layer. In this case, the optical film 60 may be positioned above the bending protection layer 70 by, for instance, the thickness of the encapsulation layer.

The bending protection layer 70 covers and protects the driving line. Moreover, the bending protection layer 70 may reinforce the strength of the substrate 81 or may relieve the stress in the bending area. The bending protection layer 70 exposes the driving line pad portion.

In some exemplary embodiments, the bending protection layer 70 may include an organic coating layer, such as at least one of polyimide, acrylate, and epoxy. In some exemplary embodiments, the bending protection layer 70 may be attached in the form of a protection film.

The driving line pads in the driving area DDR of the display panel 80 may be electrically connected to the display printed circuit board COF. For example, the driving line pads may be disposed on a surface of the substrate 81, and the display printed circuit board COF may be attached to the driving line pads by an anisotropic conductive film (ACF) or the like. The display printed circuit board COF may be a film-type flexible printed circuit board. A driver chip D_IC may be mounted on the display printed circuit board COF. The display printed circuit board COF may be implemented as a chip-on-film, a tape carrier package, or the like.

The display printed circuit board COF may be electrically connected to a main circuit board MB. The main circuit board MB may be made of a rigid printed circuit board. The main circuit board MB and the display printed circuit board COF may be attached to each other by an anisotropic conductive film (ACF) or the like.

A touch panel 30 is disposed on the display panel 80. The touch panel 30 includes a lower surface 30b facing the display panel 80 and an upper surface 30a opposed to the lower surface 30b. The touch panel 30 can acquire (or detect) position information of an input point by at least one of a capacitive method, a resistive film method, an electromagnetic induction method, and an infrared method, or the like. Although a capacitive-type touch panel 30 will be described, this is merely illustrative of some exemplary embodiments.

The touch panel 30 may overlap with the display area DAR and a part of the driving area DDR of the display panel 80. The touch panel 30 may not overlap with the portion of the substrate 81 of the display panel 80 beyond the bending portion.

The touch panel 30 may include touch electrodes and/or touch lines.

Referring to FIGS. 4 and 5, the touch panel 30 includes a sensing portion TAR and a pad side portion TDR. If the touch panel 30 has a rectangular shape when viewed from the top, e.g., in a direction opposite the third direction DR3, the touch panel 30 may include four side portions adjacent to the sides, respectively. The pad side portion TDR may be located on one of the side portions adjacent to one shorter side of the touch panel 30 when viewed from the top. The pad side portion TDR may be disposed on one side of the sensing portion TAR. For example, the pad side portion TDR may be located on one side of the sensing portion TAR in a first direction DR1. The sensing portion TAR of the touch panel 30 is disposed so as to overlap with the display area DAR of the display panel 80, and the pad side portion TAR of the touch panel 30 is disposed so as to overlap with the display area DAR of the display panel 80, but exemplary embodiments are not limited thereto.

The touch panel 30 may include a first touch protection layer 310, a first line layer 320 disposed on the first touch protection layer 310, a first touch insulating layer 330 disposed on the first line layer 320, a second touch insulating layer 350 disposed on the first touch insulating layer 330, a second line layer 360 disposed on the second touch insulating layer 350, and a second touch protection layer 370 disposed on the second line layer 360. The touch panel 30 may further include a touch coupling layer 340 that is disposed between the first touch insulating layer 330 and the second touch insulating layer 350 to couple them. The first line layer 320 and the second line layer 360 include a plurality of electrodes 321, 323, 325, 361, 363, 365, T_PAD1, T_PAD2 and T_PAD3.

The first touch protection layer 310 may cover and protect the first line layer 320. The first touch protection layer 310 may be a solder resist layer. The solder resist layer may be made of an organic material, such as polyethylene terephthalate (PET), polyimide (PI), polycarbonate (PC), polyethylene (PE), polypropylene (PP), polysulfone (PSF), poly(methyl methacrylate) (PMMA), triacetylcellulose (TAC), and cycloolefin polymer (COP).

The first line layer 320 is disposed on a surface of the first touch protection layer 310. The first line layer 320 may include first touch electrodes 321, first connection electrodes 323 connecting between adjacent ones of the first touch electrodes 321, first touch signal lines 325, and third touch signal pads T_PAD3.

The first touch electrodes 321, the first connection electrodes 323 connecting between the first touch electrodes 321, and the first touch signal lines 325 may be disposed in the sensing portion TAR of the touch panel 30. The third touch signal pads T_PAD3 may be disposed in the driving area DDR of the touch panel 30. The first touch signal lines 325 may electrically connect the first touch electrodes 321 with the third touch signal pads T_PAD3.

The first touch electrodes 321 adjacent to one another in the column direction (e.g., in the first direction DR1) are physically connected to one another through the first connection electrodes 323. The width of the first connection electrodes 323 may be smaller than the width of the first touch electrodes 321.

The first touch signal lines 325 are connected to the first touch electrodes 321 to extend toward the pad side portion TDR and form the third touch signal pads T_PAD3 at the pad side portion TDR. The first touch protection layer 310 exposes a surface of the first touch signal lines 325 at the driving area DDR of the touch panel 30. The exposed surface of the first touch signal lines 325 may become the third touch signal pad T_PAD3. The touch printed circuit board 40 may be electrically connected to the exposed third touch signal pad T_PAD3. In some exemplary embodiments, a second gap GAP2 may be formed between the first touch protection layer 310 and an end of the touch printed circuit board 40 in the first direction DR1. The second gap GAP2 may expose a portion of an upper surface of the first transparent adhesive member 50.

The touch printed circuit board 40 may be a flexible printed circuit board. The touch printed circuit board 40 may include first to third contact portions CB1 to CB3. A first contact portion CB1 located at one end of the touch printed circuit board 40 may be attached to the first touch signal pads T_PAD1 of the touch panel 30 by an anisotropic conductive film ACF or the like. The touch printed circuit board 40 may include a base film 41 and a plurality of touch lead lines LE1 to LE3 disposed on the base film 41. The third touch lead lines LE3 may be coupled with the third touch signal pads T_PAD3. The first touch lead lines LE1 may be coupled to first touch signal pads T_PAD1 to be described later, and the second touch lead lines LE2 may be coupled to second touch signal pads T_PAD2 to be described later.

The touch printed circuit board 40 may be bent so that it surrounds the bending portion of the substrate 81 of the display panel 80 on its outer side as shown in FIG. 2. The other end of the touch printed circuit board 40 may be electrically connected to the main circuit board MB. In some exemplary embodiments, a touch chip T_IC may be mounted on the touch printed circuit board 40. For instance, the touch chip T_IC may be mounted on the touch printed circuit board 40 prior to the other end of the touch printed circuit board 40 that may be electrically connected to the main board MB.

The third touch signal pad T_PAD3 may be located at the center of the pad side portion TDR when viewed from the top. The first touch signal pad T_PAD1 and the second touch signal pad T_PAD2 to be described later may be disposed with the third touch signal pad T_PAD3 therebetween. The third touch signal pads T_PAD3 may have a slightly expanded shape than the first touch signal lines 325 for connection with the touch printed circuit board 40, but this is merely illustrative and exemplary embodiments are not limited thereto.

The first touch insulating layer 330 is disposed on the first line layer 320. The first touch insulating layer 330 may be disposed over the entire surface of the first line layer 320, but exemplary embodiments are not limited thereto.

The touch coupling layer 340 may be disposed on the first touch insulating layer 330. The touch coupling layer 340 may be made of a material that can be used as a typical adhesive material to couple the first touch insulating layer 330 with the second touch insulating layer 350. For example, the touch coupling layer 340 may include a material forming a transparent adhesive member, which will be described in more detail later.

The second touch insulating layer 350 may be disposed on the touch coupling layer 340. Each of the first touch insulating layer 330 and the second touch insulating layer 350 may be made up of a single layer or multiple layers. In addition, each of the first touch insulating layer 330 and the second touch insulating layer 350 may include an inorganic material, an organic material, or a composite material. In some exemplary embodiments, the first touch insulating layer 330 and/or the second touch insulating layer 350 may include an inorganic layer. The inorganic layer may include at least one of aluminum oxide, titanium oxide, silicon oxide, silicon oxynitride, zirconium oxide, and hafnium oxide.

In some exemplary embodiments, the first touch insulating layer 330 and/or the second touch insulating layer 350 may include an organic layer. The organic layer may include at least one selected from the group consisting of an acrylic resin, a methacrylic resin, a polyisoprene, a vinyl resin, an epoxy resin, a urethane resin, a cellulose resin, a siloxane resin, a polyimide resin, a polyamide resin, and a perylene resin.

The second line layer 360 may be disposed on the second touch insulating layer 350. The second line layer 360 may include second touch electrodes 361, second connection electrodes 363 connecting between adjacent ones of the second touch electrodes 361, second touch signal lines 365, the first touch signal pads T_PAD1, and second touch signal pads T_PAD2. The first touch electrodes 321 and the second touch electrodes 361 may acquire, determine, or otherwise detect position information of a touched (or touch interaction) point by a self-capacitance method and/or a mutual capacitance method.

The second touch electrodes 361, the second connection electrodes 363 connecting between the second touch electrodes 361, and the second touch signal lines 365 may be disposed in the sensing portion TAR of the touch panel 30. The first touch signal pads T_PAD1 and the second touch signal pads T_PAD2 may be disposed in the pad side portion TDR of the touch panel 30. The second touch signal lines 365 may electrically connect the second touch electrodes 361 with the first touch signal pads T_PAD1 and the second touch electrodes 361 with the second touch signal pads T_PAD2. The first touch signal pads T_PAD1 may be disposed on one side of the third touch signal pads T_PAD3 that faces the sensing portion TAR from the pad side portion TDR when viewed from the top. The second touch signal pads T_PAD2 may be disposed on the other side of the third touch signal pads T_PAD3 that faces the sensing portion TAR from the pad side portion TDR when viewed from the top. For example, the first touch signal pads T_PAD1 may be disposed on one side (e.g., the left side) of the third touch signal pads T_PAD3 in the second direction DR2 when viewed from the top, and the second touch signal pads T_PAD2 may be disposed on the other side (e.g., the right side) of the third touch signal pads T_PAD3 in the second direction DR2.

The second touch electrodes 361 adjacent to one another in the row direction (e.g., the second direction DR2) are physically connected to one another through the second connection electrodes 363. The width of the second connection electrodes 363 may be smaller than the width of the second touch electrodes 361.

The second touch signal lines 365 are connected to the second touch electrodes 361 to extend toward the pad side portion TDR and form the first touch signal pads T_PAD1 and the second touch signal pads T_PAD2 at the pad side portion TDR. The second touch protection layer 370 exposes a surface of the second touch signal lines 365 at the pad side portion TDR of the touch panel 30. The exposed surface of the second touch signal lines 365 may become the first touch signal pads T_PAD1 or the second touch signal pads T_PAD2. The first and second touch signal pads T_PAD1 and T_PAD2 may be arranged in (e.g., spaced apart from one another in) the second direction DR2.

The touch printed circuit board 40 may be electrically connected to the exposed first and second touch signal pads T_PAD1 and T_PAD2. The first contact portion CB1 of the touch printed circuit board 40 may be attached to the first touch signal pads T_PAD1 by an anisotropic conductive film (ACF), etc., and the second contact portion CB2 may be attached to the second touch signal pads T_PAD2 by an anisotropic conductive film (ACF), etc.

The first and second touch signal pads T_PAD1 and T_PAD2 may have a slightly expanded shape than the second touch signal lines 365 for connection with the touch printed circuit board 40, but this is merely illustrative and exemplary embodiments are not limited thereto.

The first touch electrodes 321 and the second touch electrodes 361 may be arranged in a matrix when viewed from the top. Each of the first touch electrodes 321 and the second touch electrodes 361 may have, but is not limited to, a diamond shape. The first touch electrodes 321 may be electrically connected to one another in the column direction (e.g., the longer side direction), and the second touch electrodes 361 may be electrically connected to one another in the row direction (e.g., the shorter side direction). Exemplary embodiments, however, are not limited thereto. For instance, the first touch electrodes 321 may be electrically connected to one another in the row direction, and the second touch electrodes 361 may be electrically connected to one another in the column direction. The first touch electrodes 321 and the second touch electrodes 361 are spaced apart and isolated from one another by the first and second touch insulating layers 330 and 350 disposed therebetween.

Each of the first line layer 320 and the second line layer 360 may be made of a conductive material. For example, the first line layer 320 and the second line layer 360 may be made of a material including at least one of a transparent conductive oxide, such as indium tin oxide (ITO), indium zinc oxide (IZO), zinc oxide (ZnO), or indium tin zinc oxide (ITZO); a metal material, such as molybdenum, silver, titanium, copper, aluminum, or an alloy of at least two of the aforementioned metal materials; a conductive polymer, such as poly(3,4-ethylenedioxythiophene) (PEDOT), etc.; metal nanolines (or nanotubes); carbon nanotubes; graphene; etc.

In some exemplary embodiments, the first line layer 320 and the second line layer 360 may include an opaque material, and, as such, the first touch electrodes 321 and the second touch electrodes 361 may have a mesh shape.

The window 10 is disposed on the touch panel 30. The window 10 serves to cover and protect the touch panel 30 and/or the display panel 80. In some exemplary embodiments, the window 10 completely overlaps with the touch panel 30. The window 10 may be larger than the touch panel 30 and its side surfaces may protrude from the side surfaces of the touch panel 30, respectively. In addition, the window 10 may completely overlap with the display area DAR of the display panel 80, as well as the driving area DDR. The window 10 may be larger than the display panel 80 and its side surfaces may protrude from the sides of the display panel 80, respectively. The window 10 may cover even the bending portion of the substrate 81 of the display panel 80.

The window 10 may be made of a transparent material. The window 10 may include, for example, glass or plastic. When the window 10 includes plastic, the window 10 may have flexible nature.

Examples of plastics applicable to the window 10 may include, but are not limited to, polyimide, polyacrylate, poly(methyl methacrylate) (PMMA), polycarbonate (PC), polyethylene naphthalate (PEN), polyvinylidene chloride (PVDC), polyvinylidene difluoride (PVDF), polystyrene, ethylene vinyl alcohol (EVOH) copolymer, polyethersulfone (PES), polyetherimide (PEI), polyphenylene sulfide (PPS), polyallylate, tri-acetyl cellulose (TAC), cellulose acetate propionate (CAP), and the like. The window 10 may include one or more of the aforementioned plastic materials.

If the window 10 includes plastic, it may further include a coating layer (not shown) disposed on each of the upper and lower surfaces of the plastic. In some exemplary embodiments, the coating layers may be a hard coating layer including an organic layer containing an acrylate compound and/or an organic-inorganic hybrid layer. The organic layer may include an acrylate compound. The organic-inorganic hybrid layer may be a layer in which an inorganic material, such as silicon oxide, zirconium oxide, aluminum oxide, tantalum oxide, or niobium oxide, and glass beads is dispersed in an organic material, such as an acrylate compound. In some exemplary embodiments, the coating layer may include a metal oxide layer. The metal oxide layer may include, but is not limited to, metal oxides, such as titanium, aluminum, molybdenum, tantalum, copper, indium, tin, and/or tungsten.

The second transparent adhesive member 20 is disposed between the window 10 and the touch panel 30. The window 10 and the touch panel 30 may be coupled with each other by the second transparent adhesive member 20. The first transparent adhesive member 50 is disposed between the touch panel 30 and the display panel 80. The touch panel 30 and the display panel 80 may be coupled with each other by the first transparent adhesive member 50.

Each of the first transparent adhesive member 50 and the second transparent adhesive member 20 may be made of an optically transparent adhesive film, an optically transparent adhesive tape, or an optically transparent resin.

The first transparent adhesive member 50 and the second transparent adhesive member 20 may be made of the same material, but they may have different properties. For example, the first transparent adhesive member 50 may have a lower modulus (e.g., modulus of elasticity, flexural modulus, etc.) than the second transparent adhesive member 20.

The first transparent adhesive member 50 may be thinner than the second transparent adhesive member 20. For example, the thickness of the first transparent adhesive member 50 may be 0.1 mm, and the thickness of the second transparent adhesive member 20 may be 0.15 mm. It is, however, to be understood that the thicknesses of the first transparent adhesive member 50 and the second transparent adhesive member 20 are not limited to the aforementioned numerical values.

The first transparent adhesive member 50 and the second transparent adhesive member 20 have generally similar shapes and sizes, but not all the sides may be aligned with one another. That is to say, a part of the first transparent adhesive member 50 and the second transparent adhesive member 20 may not overlap with one another when viewed from the top. A more detailed description thereon will be given later.

The display device 100 may further include a cover panel sheet 90. The cover panel sheet 90 may be attached to the rear surface of the display area DAR of the display panel 80. The cover panel sheet 90 includes at least one functional layer. The functional layer may perform a heat dissipation function, an electromagnetic wave shielding function, a grounding function, a buffering function, a strength enhancing function, a supporting function, and/or a digitizing function. The functional layer may be a sheet layer made of a sheet, a film layer made of a film, a thin film layer, a coating layer, a panel, a plate, etc. A single functional layer may be made up of a single layer or a plurality of thin films or coating layers stacked on one another. The functional layer may be, for example, a supporting substrate, a heat-radiating layer, an electromagnetic wave shielding layer, a shock absorbing layer, a digitizer, etc.

The substrate 81 of the driving area DDR of the display panel 80 and the display printed circuit board COF and the main circuit board MB connected thereto may be located under the cover panel sheet 90. The bent touch printed circuit board 40 may also be located under the cover panel sheet 90. The lower surface of the cover panel sheet 90 may be coupled with the other surface of the substrate 81 and/or the main circuit board MB by an adhesive layer, but is not limited thereto.

Hereinafter, the positional relationship among the touch panel 30, the first transparent adhesive member 50, and the second transparent adhesive member 20 will be described in more detail.

The shape of the touch panel 30 may conform to the shape of the display area DAR of the display panel 80 when viewed from the top as shown in FIGS. 1 and 3. When the display area DAR of the display panel 80 has a rectangular shape with rounded corners, the shape of the touch panel 30 may also have a rectangular shape with rounded corners when viewed from the top. The side surface of the touch panel 30 on the pad side portion TDR may have a straight line shape when viewed from the top.

According to some exemplary embodiments, the upper surface 30a of the pad side portion TDR of the touch panel 30 may include a first connection area CNA1 to which the first contact portion CB1 of the touch printed circuit board 40 is attached, a second connection area CNA2 to which the second contact portion CB2 of the touch printed circuit board 40 is attached, and a first non-connection area NCA1 to which none of the first and second contact portions CB1 and CB2 of the touch printed circuit board 40 is attached.

The first touch signal pads T_PAD1 and second touch signal pads T_PAD2 are disposed in the first connection area CNA1 and the second connection area CNA2, respectively. None of the first touch signal pads T_PAD1 and the second touch signal pad T_PAD2 is disposed in the first non-connection area NCA1 or a dummy pad may be disposed in the first non-connection area NCA1, but the touch printed circuit board 40 is not directly attached to it.

In addition, the lower surface 30b of the pad side portion TDR of the touch panel 30 may include a third connection area CNA3 to which the third contact portion CB3 of the touch printed circuit board 40 is attached, and a second non-connection area NCA2 to which the third contact portion CB3 of the touch printed circuit board 40 is not attached.

Third touch signal pads T_PAD3 are disposed in the third connection area CNA3. None of the third touch signal pads T_PAD3 is disposed in the second non-connection area NCA2 or a dummy pad may be disposed in the second non-connection area NCA2, but the touch printed circuit board 40 is not directly attached to it.

The first connection area CNA1 and the second connection area CNA2 may be spaced apart from each other with the third connection area CNA3 therebetween when viewed from the top. The first non-connection area NCA1 may overlap with the third connection area CNA3 in the thickness direction (e.g., in the third direction DR3), and the second non-connection area NCA2 may overlap with the first connection area CNA1 and the second connection area CNA2 in the thickness direction.

In some exemplary embodiments, the side surface of the pad side portion TDR of the touch panel 30 may not be a straight line when viewed from the top For example, the profile of the side surface of the pad side portion TDR of the touch panel 30 when viewed from the top may include a reference line and a protrusion protruding outward from the reference line. The protrusion of the pad side portion TDR may be disposed in line with the first to third connection areas CNA1 to CNA3. For instance, the pad side portion TDR of the touch panel 30 may have the protrusion in the third connection area CNA3. Further, the pad side portion TDR of the touch panel 30 may have the protrusions at the first and second connection areas CNA1 and CNA2.

The second transparent adhesive member 20 is disposed on the upper surface 30a of the touch panel 30, and the first transparent adhesive member 50 is disposed on the lower surface 30b of the touch panel 30. The first transparent adhesive member 50 and the second transparent adhesive member 20 have a shape generally similar to the touch panel 30 when viewed from the top. The first and second transparent adhesive members 50 and 20 may generally overlap with the sensing portion TAR of the touch panel 30.

The side surface of each of the first transparent adhesive member 50 and the second transparent adhesive member 20 may be disposed more to the inside than the side surface of the touch panel 30. In other words, the side surface of the touch panel 30 at that part may protrude outwardly from the side surface of the first transparent adhesive member 50 and the side surface of the second transparent adhesive member 20.

According to some exemplary embodiments, the edge of one surface of the touch panel 30 may not be covered by the first transparent adhesive member 50, and the edge of the other surface of the touch panel 30 may not be covered by the second transparent adhesive member 20. As the first and second transparent adhesive members 50 and 20 are not completely formed up to the side surface of the touch panel 30 as described above, it is possible to prevent (or at least reduce) the overflow of the adhesive material, such as prevent the overflow of the adhesive material beyond the edge of the touch panel 30.

The side surface of each of the first transparent adhesive member 50 and the second transparent adhesive member 20 may have a straight line shape in parallel with the upper surface 30a of the touch panel 30 on the sides other than the pad side portion TDR of the touch panel 30. The first transparent adhesive member 50 and the second transparent adhesive member 20 may have the same shape on the sides other than the pad side portion TDR of the touch panel 30 when viewed from the top. On the sides other than the pad side portion TDR, the side surface of the first transparent adhesive member 50 may be aligned with the side surface of the second transparent adhesive member 20 without being protruded therefrom.

On the pad side portion TDR of the touch panel 30, the first transparent adhesive member 50 may partially protrude outwardly from the second transparent adhesive member 20.

For instance, the first and second transparent adhesive members 50 and 20 may include shorter side edges extending along the boundary of the sensing portion TAR adjacent to the pad side portion TDR of the touch panel 30, and the side surfaces included in the shorter side edges of the first and second transparent adhesive members 50 and 20 may be aligned with each other in the thickness direction. That is to say, the side surfaces included in the shorter edges of the first and second transparent adhesive members 50 and 20 may be aligned with each other in the thickness direction in the second non-connection area NCA2, but not in the thickness direction in the third connection area CNA3. The side surface of the first transparent adhesive member 50 on the third connection area CNA3 may include a protrusion PT protruding outwardly relative to the second non-connection area NCA2. The protrusion PT may protrude from the first transparent adhesive member 50 disposed in the sensing portion TAR and may be disposed on the pad side portion TDR, e.g., on the third connection area CNA3. Thus, the side surface of the first transparent adhesive member 50 on the third connection area CNA3 protrudes outwardly from the side surface of the second transparent adhesive member 20 on the second non-connection area NCA2, and may protrude outwardly more than the side surface of the second transparent adhesive member 20.

The protrusion PT of the first transparent adhesive member 50 may partially cover a surface of the third contact portion CB3 of the touch printed circuit board 40 attached to the lower surface 30b of the touch panel 30. That is to say, the protrusion PT of the first transparent adhesive member 50 may include a portion overlapping with the third contact portion CB3 of the touch printed circuit board 40 in the thickness direction, and a non-overlapping portion. The thickness t2 of the portion of the protrusion PT that overlaps with the third contact portion CB3 of the touch printed circuit board 40 may be smaller than the thickness t1 of the non-overlapping portion.

The first transparent adhesive member 50 may be in contact with a surface of the third contact portion CB3 of the touch printed circuit board 40. Accordingly, a space between the touch printed circuit board 40 and the optical film 60 of the display panel 80 thereunder can be filled with the first transparent adhesive member 50, and a surface of the third contact portion CB3 of the touch printed circuit board 40 can be secured by the first transparent adhesive member 50.

After the third contact portion CB3 of the touch printed circuit board 40 has been attached, the third contact portion CB3 of the touch printed circuit board 40 may be detached when it is bent due to tension. As such, the first transparent adhesive member 50 is disposed up to the third contact portion CB3 of the touch printed circuit board 40 to thereby prevent the third contact portion CB3 from being detached. In addition, by eliminating the space between the display panel 80 and the touch printed circuit board 40, it is possible to protect the display device 1 from external impact. Further, by suppressing fluctuation of the display panel 80 and the touch printed circuit board 40, it is possible to improve flatness of the display device 1.

Referring to FIGS. 6 and 8, the protrusion PT of the first transparent adhesive member 50 may cover not only the surface of the third contact portion CB3 of the touch printed circuit board 40, but also the side surface thereof.

The width of the protrusion PT of the first transparent adhesive member 50 in the second direction DR2 may be greater than the width of the third contact portion CB3 of the touch printed circuit board 40 in the second direction DR2. The protrusion PT of the first transparent adhesive member 50 may be in contact with the first touch protection layer 310 located on one side and the other side of the first touch signal lines 325 in the second direction DR2, and may cover the side surface of the third contact portion CB3 of the touch printed circuit board 40. The first transparent adhesive member 50 may be in contact with the first touch protection layer 310 located on one side and the other side of the first touch signal lines 325 in the second direction DR2. By doing so, it is possible to further suppress the fluctuation of the third contact portion CB3 of the touch printed circuit board 40.

Further, the protrusion PT of the first transparent adhesive member 50 may be disposed such that it overlaps with a portion exposed by the first touch protection layer 310, which is not coupled with the third touch lead lines LE3. For instance, the first transparent adhesive member 50 may cover the side surface of the third contact portion CB3 of the touch printed circuit board 40 and overlap with the first touch signal lines 325 exposed by the first touch protection layer 310 so that it is possible to prevent the corrosion promoting ions CPI eluted from the polarizing film 65 of the optical film 60 from corroding the third touch signal pads T_PAD3 and the third touch lead lines LE3.

Figure 9:
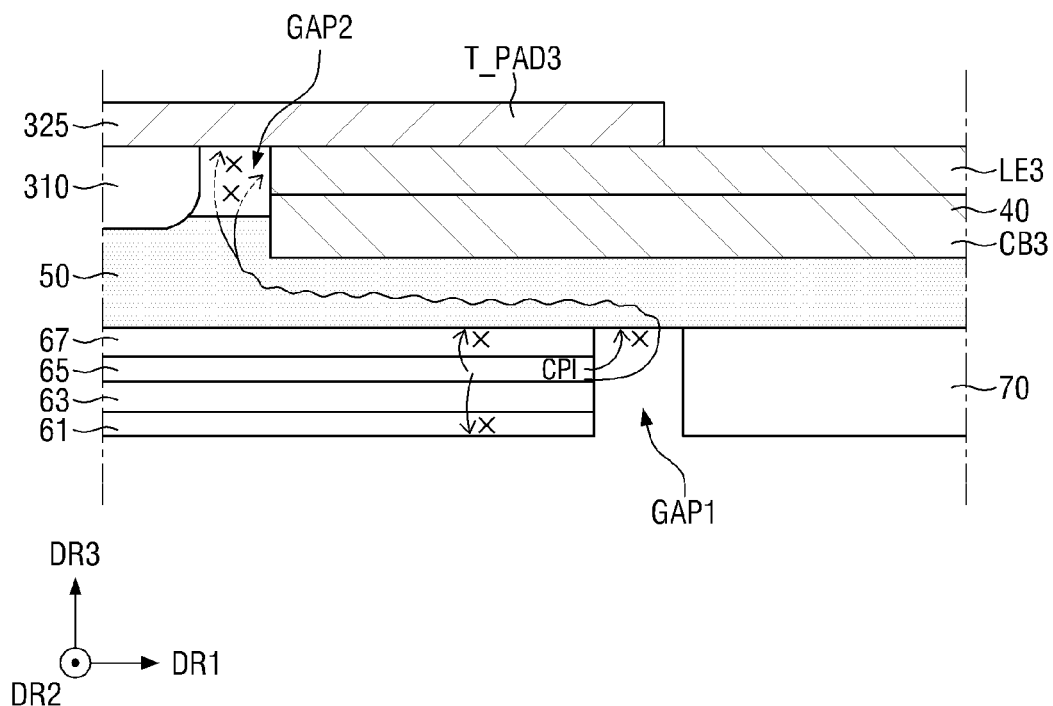
FIG. 9 is an enlarged, cross-sectional view of a part of a display device according to some exemplary embodiments.
Figure 10:
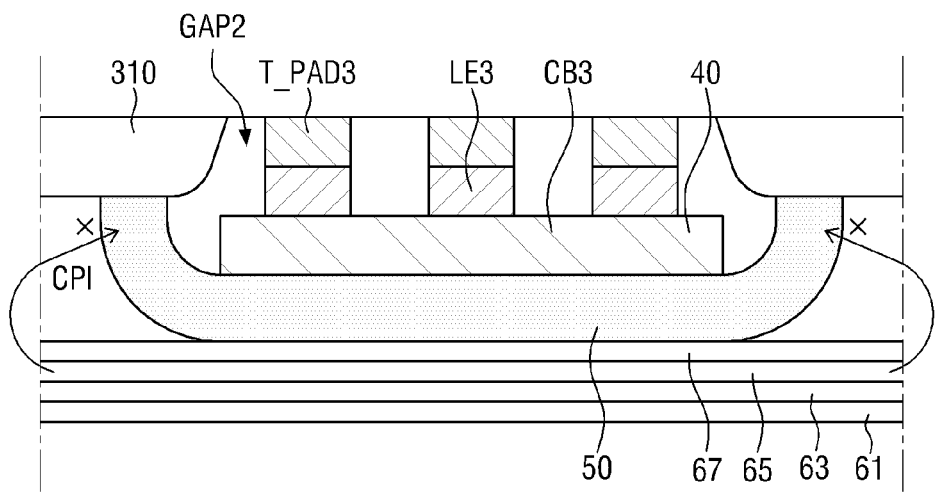
FIG. 10 is an enlarged view of the cross-sectional view of the display device of FIG. 9 according to some exemplary embodiments.

FIG. 9 is an enlarged, cross-sectional view of a part of a display device according to some exemplary embodiments. FIG. 10 is an enlarged view of the cross-sectional view of the display device of FIG. 9 according to some exemplary embodiments.

FIGS. 9 and 10 show the paths along which the corrosion promoting ions CPI of the polarizing film 65 can move to the third touch signal pads T_PAD3 and the third touch lead lines LE3. The corrosion promoting ions CPI may be eluted from a side surface of the polarizing film 65 in the first direction DR1 to move through a first gap GAP1 between the optical film 60 and the bending protection layer 70 as shown in FIG. 9, or may be eluted from side surfaces of the polarizing film 65 in the second direction DR2 to move as shown in FIG. 10.

In this regard, for the display device 1 according to some exemplary embodiments, the first transparent adhesive member 50 may include the protrusion PT that protrudes on the third connection area CNA3 to cover the side surface of the third contact portion CB3 of the touch printed circuit board 40 and overlaps with the first touch signal lines 325 exposed by the first touch protection layer 310. That is to say, the first transparent adhesive member 50 is disposed on the two paths that would otherwise allow the corrosion promoting ions CPI of the polarizing film 65 to move to the third touch signal pads T_PAD3 and the third touch lead lines LE3. As such, it is possible to prevent the corrosion promoting ions CPI from eroding the third touch signal pads T_PAD3 and the third touch lead lines LE3 or at least to slow down the corrosion. In this manner, it is possible to prevent line cracking and/or line disconnection due to corrosion of the third touch signal pads T_PAD3 and the third touch lead lines LE3.

Hereinafter, display devices according to other exemplary embodiments will be described. In the following description, the same or similar elements will be denoted by the same or similar reference numerals, and redundant descriptions will be omitted or briefly described.

Figure 11:
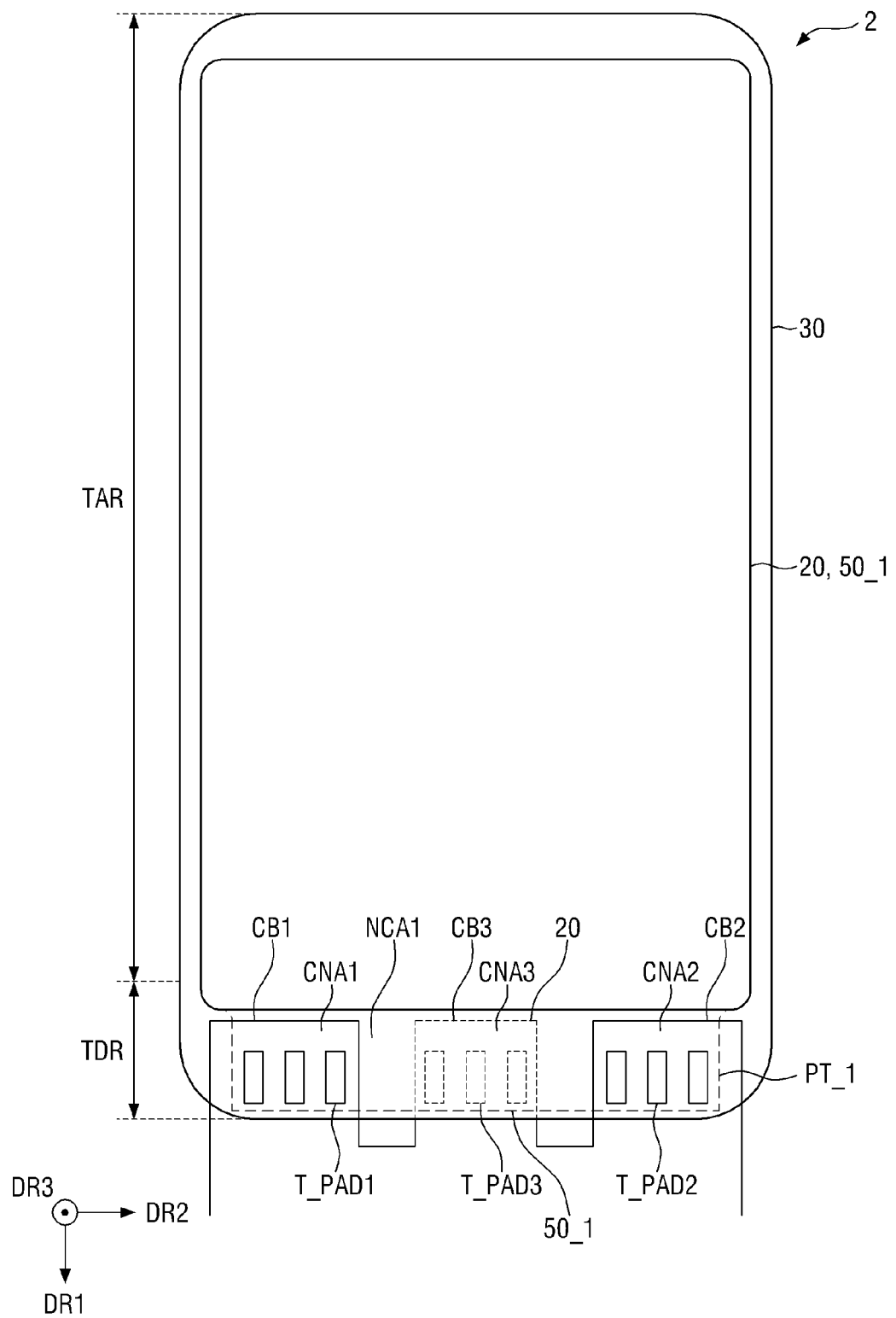
FIG. 11 is a top plan view showing the layout of a touch panel and first and second transparent adhesive members according to some exemplary embodiments.
Figure 12:
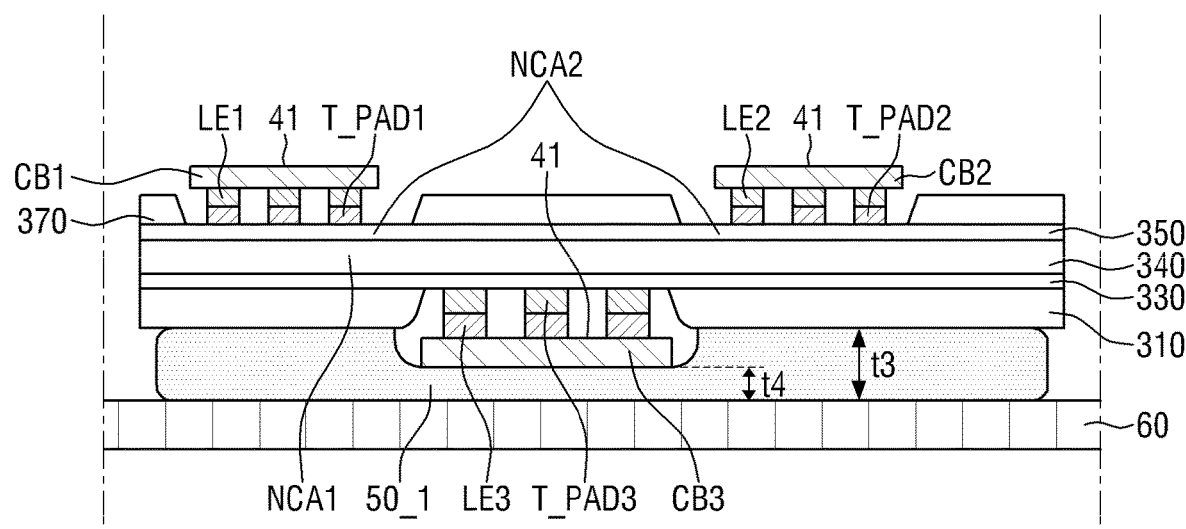
FIG. 12 is a cross-sectional view of FIG. 11 according to some exemplary embodiments.

FIG. 11 is a top plan view showing the layout of a touch panel and first and second transparent adhesive members according to some exemplary embodiments. FIG. 12 is a cross-sectional view of FIG. 11 according to some exemplary embodiments.

A display device 2 according to some exemplary embodiments is different from the display device 1 in that the width of the first transparent adhesive member 50_1 is larger than the width of the first transparent adhesive member 50. For instance, the first transparent adhesive member 50_1 not only may be disposed in the third connection region CNA3 of the pad side portion TDR on the lower surface 30b of the touch panel 30, but also may be extended to the second non-connection area NCA2. The first transparent adhesive member 50_1 may be extended to one side and the other side of the third connection area CNA3 of the pad side portion TDR of the lower surface 30b of the touch panel 30 in the second direction DR2. As such, the first transparent adhesive member 50_1 may overlap with the first and second connection areas CNA1 and CNA2 of the pad side portion TDR of the upper surface 30a of the touch panel 30.

As shown in FIG. 12, the first transparent adhesive member 50_1 may be in contact with one surface of the third contact portion CB3 of the touch printed circuit board 40, and further disposed in a step space between the first touch protection layer 310 of the touch panel 30 and the optical film 60 so as to be in direct contact with the optical film 60 and the first touch protection layer 310. Accordingly, the space between the touch printed circuit board 40 and the optical film 60 of the display panel 80 thereunder can be filled with the first transparent adhesive member 50_1, and a surface of the third contact portion CB3 of the touch printed circuit board 40 can be secured by the first transparent adhesive member 50_1.

The thickness t4 of the portion of the protrusion PT_1 that overlaps with the third contact portion CB3 of the touch printed circuit board 40 may be smaller than the thickness t3 of the portion of the protrusion PT_1 that does not overlap with the third contact portion CB3 of the touch printed circuit board 40 and is in contact with the optical film 60 and the first touch protection layer 310.

According to some exemplary embodiments, the first transparent adhesive member 50_1 is disposed on the two paths that would otherwise allow the corrosion promoting ions CPI of the polarizing film 65 to move to the third touch signal pads T_PAD3 and the third touch lead lines LE3 so that it is possible to prevent the corrosion promoting ions CPI from eroding the third touch signal pads T_PAD3 and the third touch lead lines LE3 or at least to slow down the corrosion. In this manner, it is possible to prevent line cracking and/or line disconnection due to corrosion of the third touch signal pads T_PAD3 and the third touch lead lines LE3.

Figure 13:
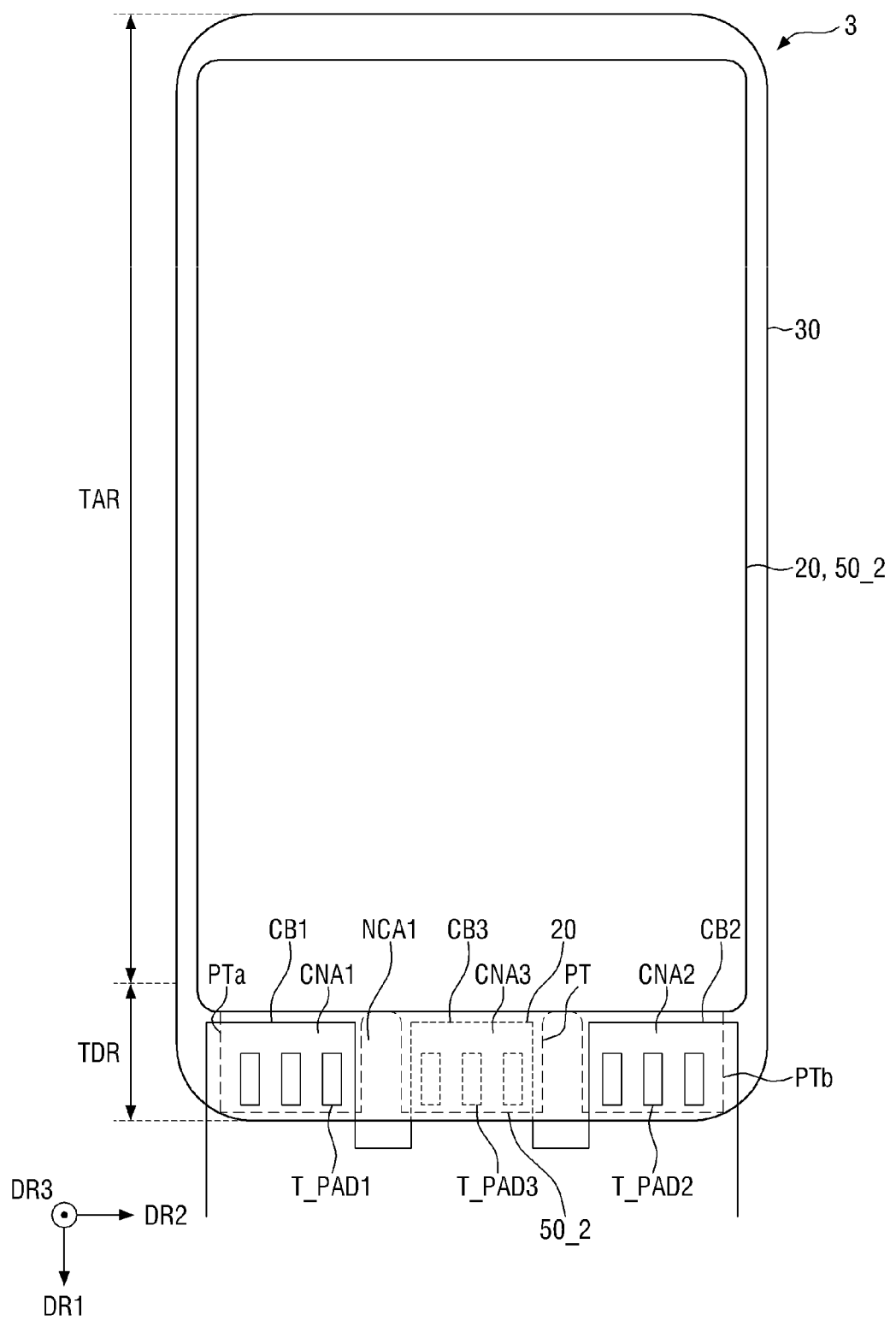
FIG. 13 is a top plan view showing the layout of a touch panel and first and second transparent adhesive members according to some exemplary embodiments.

FIG. 13 is a top plan view showing the layout of a touch panel and first and second transparent adhesive members according to some exemplary embodiments. FIG. 14 is a cross-sectional view of FIG. 13 according to some exemplary embodiments.

A display device 3 according to some exemplary embodiments is different from the display device 2 in that a first transparent adhesive member 50_2 includes a plurality of protrusions PTa, PT, and PTb spaced apart from each other. For instance, the first transparent adhesive member 50_2 according to some exemplary embodiments may include a plurality of protrusions PT, PTa, and PTb spaced apart from each other in the second direction DR2. The first transparent adhesive member 50_2 may include a protrusion PT disposed in the third connection area CNA3, a first subsidiary protrusion PTa disposed on one side (e.g., a left side) of the protrusion PT in the second direction DR2, and a second subsidiary protrusion PTb disposed on the other side (e.g., the right side) of the protrusion PT in the second direction DR2.

The first subsidiary protrusion PTa, the protrusion PT, and the second subsidiary protrusion PTb may be spaced apart from one another. The first subsidiary protrusion PTa and the second subsidiary protrusion PTb may be disposed in respective portions of the second non-connection area NCA2. The side surfaces of the first subsidiary protrusion PTa and the second subsidiary protrusion PTb protrude outwardly from the side surface of the first transparent adhesive member 50_2 on the first and second connection areas CNA1 and CNA2, respectively.

According to some exemplary embodiments, the first transparent adhesive member 50_2 includes the plurality of protrusions PT, PTa, and PTb spaced apart from one another so that a space between the touch printed circuit board 40 and the optical film 60 of the display panel 80 thereunder can be filled with the first transparent adhesive member 50_2, and a surface of the third contact portion CB3 of the touch printed circuit board 40 can be secured by the first transparent adhesive member 50_2.

Similarly to the protrusion PT_1 of display device 2, the thickness of the protrusion PT of the first transparent adhesive member 50_2 disposed on the surface of the third contact portion CB3 of the touch printed circuit board 40 may be smaller than the thickness of the first and second subsidiary protrusions PTa and PTb of the adjacent peripheral region as the contact portion CB3 of the touch printed circuit board 40 is pressed. As a result, the third contact portion CB3 of the touch printed circuit board 40 may be pressed such that some of the constituent materials of the protrusion PT of the first transparent adhesive member 50_2 may move along the second direction DR2 to form the first and second subsidiary protrusions PTa and PTb.

As shown in FIGS. 13 and 14, when the first transparent adhesive member 50_2 has an expanded shape in the adjacent second non-connection area NCA2, as well as the third connection area CNA3, some of the constituent materials of the protrusion PT of the first transparent adhesive member 50_2 may move around along the second direction DR2. In this regard, according to some exemplary embodiments, the first transparent adhesive member 50_2 includes a plurality of protrusions PT, PTa, and PTb spaced apart from one another so that a space between the protrusions PT, PTa, and PTb is filled with the constituent materials of the protrusion PT of the first transparent adhesive member 50_2 moving around the direction DR2 when viewed from the top. As a result, it is possible to prevent the first transparent adhesive member 50_2 from being detached.

Although the length of each of the first subsidiary protrusion PTa and the second subsidiary protrusion PTb protruding in the first direction DR1 may be equal to the length of the protrusion PT in the first direction DR1 in the example shown in FIG. 13, this is merely illustrative and exemplary embodiments are not limited thereto. The length of one or more of the first subsidiary protrusion PTa and the second subsidiary protrusion PTb in the first direction DR1 may be less than the length of the protrusion PT protruding in the first direction DR1.

According to some exemplary embodiments, the first transparent adhesive member 50_2 is disposed on the two paths that would otherwise allow the corrosion promoting ions CPI of the polarizing film 65 to move to the third touch signal pads T_PAD3 and the third touch lead lines LE3 so that it is possible to prevent the corrosion promoting ions CPI from eroding the third touch signal pads T_PAD3 and the third touch lead lines LE3 or at least to slow down the corrosion. In this manner, it is possible to prevent line cracking and/or line disconnection due to corrosion of the third touch signal pads T_PAD3 and the third touch lead lines LE3.

Figure 15:
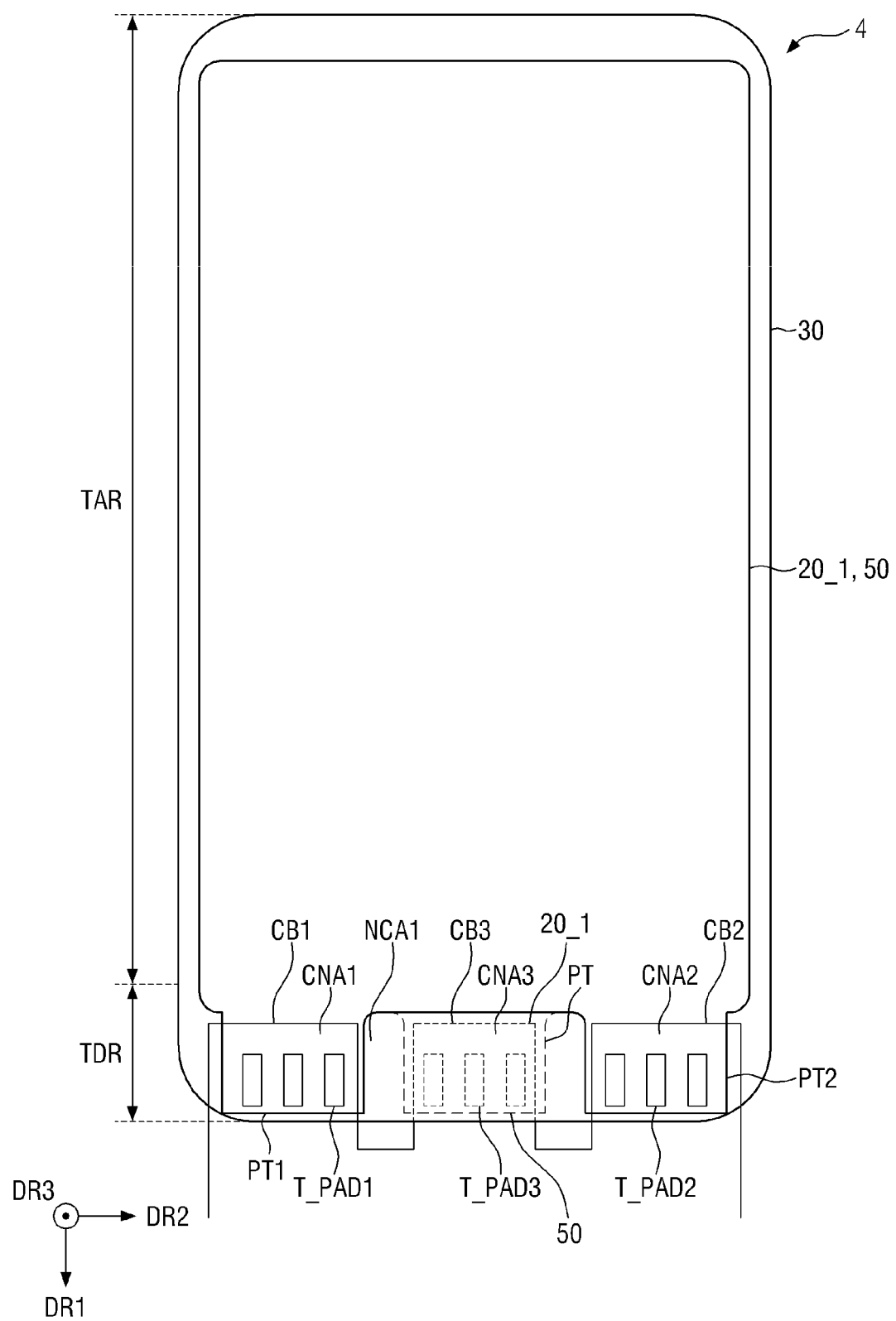
FIG. 15 is a top plan view showing the layout of a touch panel and first and second transparent adhesive members according to some exemplary embodiments.
Figure 16:
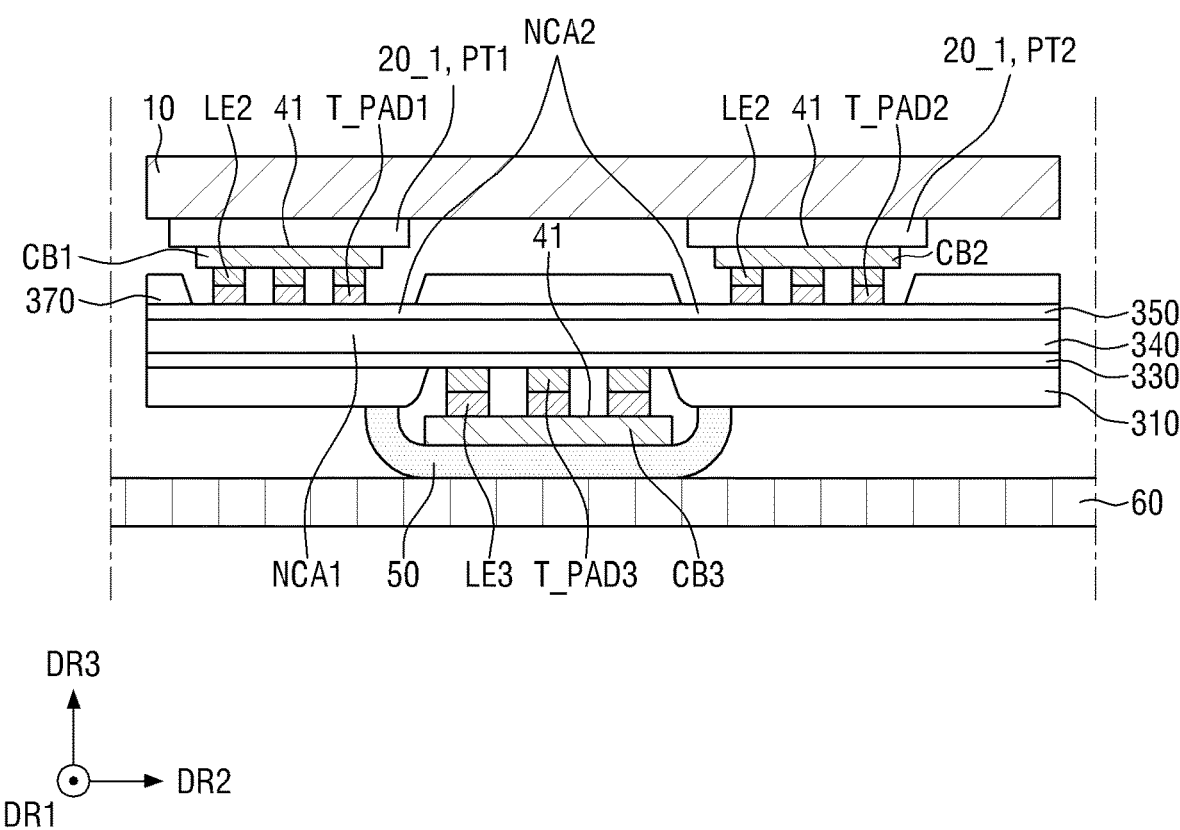
FIG. 16 is a cross-sectional view of FIG. 15 according to some exemplary embodiments.

FIG. 15 is a top plan view showing the layout of a touch panel and first and second transparent adhesive members according to some exemplary embodiments. FIG. 16 is a cross-sectional view of FIG. 15 according to some exemplary embodiments.

A display device 4 according to some exemplary embodiments is different from the display device 1 in that a second transparent adhesive member 20_1 includes second protrusions PT2 that protrude outwardly from the second transparent adhesive member 20 on the first and second connection areas CNA1 and CNA2. For instance, the second transparent adhesive member 20_1 may include second protrusions PT2 protruding outwardly from the second transparent adhesive member 20_1 on the first and second connection areas CNA1 and CNA2 in the first direction DR1.

In some exemplary embodiments, the second transparent adhesive member 20_1 may protrude outwardly more on the first connection area CNA1 and the second connection area CNA2 than on the first non-connection area NCA1. The second protrusions PT2 of the second transparent adhesive member 20_1 may not overlap with the protrusion PT of the first transparent adhesive member 50 thereunder in the thickness direction. It is, however, contemplated that exemplary embodiments are not limited thereto. The second protrusions PT2 of the second transparent adhesive member 20_1 may partially overlap with the protrusion PT of the first transparent adhesive member 50 thereunder in the thickness direction.

The second transparent adhesive member 20_1 convexly protruding on the first and second connection areas CNA1 and CNA2 may partially cover the surface of each of the first and second contact portions CB1 and CB2 of the touch printed circuit board 40 attached to the touch panel 30 as shown in FIG. 16. The second transparent adhesive member 20_1 may be in contact with a surface of each of the first and second contact portions CB1 and CB2 of the touch printed circuit board 40. Accordingly, a space between the touch printed circuit board 40 and the window 10 can be filled with the second transparent adhesive member 20_1, and a surface of the first and second contact portions CB1 and CB2 of the touch printed circuit board 40 can be secured by the second transparent adhesive member 20_1. After the touch printed circuit board 40 has been attached, the first and second contact portions CB1 and CB2 of the touch printed circuit board 40 may be detached when it is bent due to tension. In this regard, the second transparent adhesive member 20_1 may be disposed up to the first and second contact portions CB1 and CB2 of the touch printed circuit board 40 to thereby prevent the first and second contact portions CB1 and CB2 from being detached. In addition, by eliminating the space between the window 10 and the touch printed circuit board 40, it is possible to protect the display device 4 from external impact. Further, by suppressing fluctuation of the window 10 and the touch printed circuit board 40, it is possible to improve flatness of the display device 4.

Figure 17:
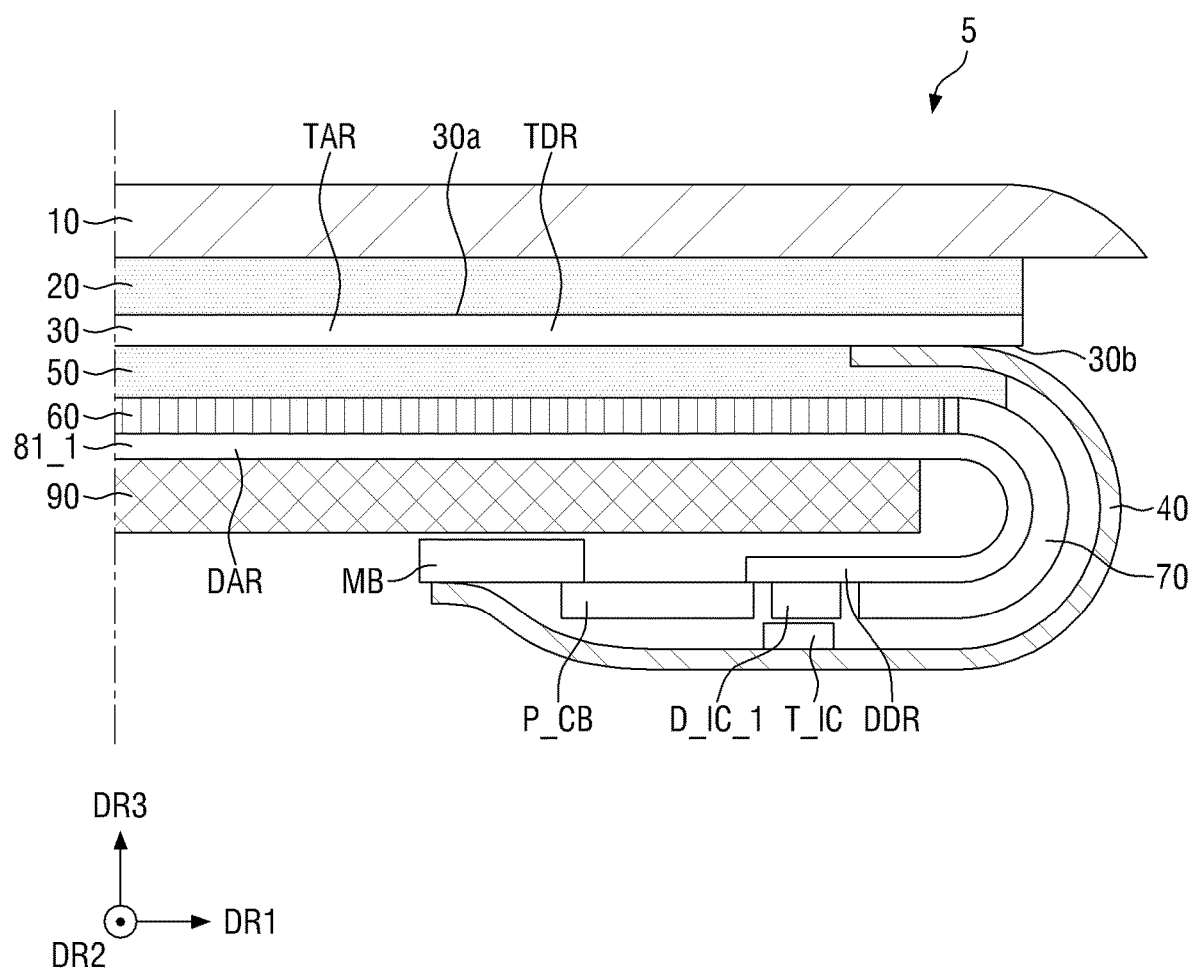
FIG. 17 is a cross-sectional view of a display device according to some exemplary embodiments.

FIG. 17 is a cross-sectional view of a display device according to some exemplary embodiments.

A display device 5 according to some exemplary embodiments is different from the display device 1 in that a driver chip D_IC_1 is mounted on the display panel 80 instead of the display printed circuit board P_CB. For instance, in the display device 5 according to some exemplary embodiments, the driver chip D_IC_1 is mounted on substrate 81_1 of the display panel 80. One end of the display printed circuit board P_CB may be connected to the end of the display panel 80, and the other end of the display printed circuit board P_CB may be connected to an end of the main circuit board MB.

According to some exemplary embodiments, after the third contact portion CB3 of the touch printed circuit board 40 has been attached, the third contact portion CB3 of the touch printed circuit board 40 may be detached when it is bent due to tension. In this regard, the first transparent adhesive member 50 is disposed up to the third contact portion CB3 of the touch printed circuit board 40 to thereby prevent the third contact portion CB3 from being detached. In addition, by eliminating a space between the display panel 80 and the touch printed circuit board 40, it is possible to protect the display device 5 from external impact. Further, by suppressing fluctuation of the display panel 80 and the touch printed circuit board 40, it is possible to improve flatness of the display device 5.

In addition, the width of the protrusion PT of the first transparent adhesive member 50 in the second direction DR2 may be greater than the width of the third contact portion CB3 of the touch printed circuit board 40 in the second direction DR2. The protrusion PT of the first transparent adhesive member 50 may be in contact with the first touch protection layer 310 located on one side and the other side of the first touch signal lines 325 in the second direction DR2, and may cover the side surface of the third contact portion CB3 of the touch printed circuit board 40. The first transparent adhesive member 50 may be in contact with the first touch protection layer 310 located on one side and the other side of the first touch signal lines 325 in the second direction DR2. By doing so, it is possible to further suppress the fluctuation of the third contact portion CB3 of the touch printed circuit board 40.

Further, the first transparent adhesive member 50 is disposed on the two paths that would otherwise allow the corrosion promoting ions CPI of the polarizing film 65 to move to the third touch signal pads T_PAD3 and the third touch lead lines LE3 so that it is possible to prevent the corrosion promoting ions CPI from eroding the third touch signal pads T_PAD3 and the third touch lead lines LE3 or at least to slow down the corrosion. In this manner, it is possible to prevent line cracking and/or line disconnection due to corrosion of the third touch signal pads T_PAD3 and the third touch lead lines LE3.

Figure 18:
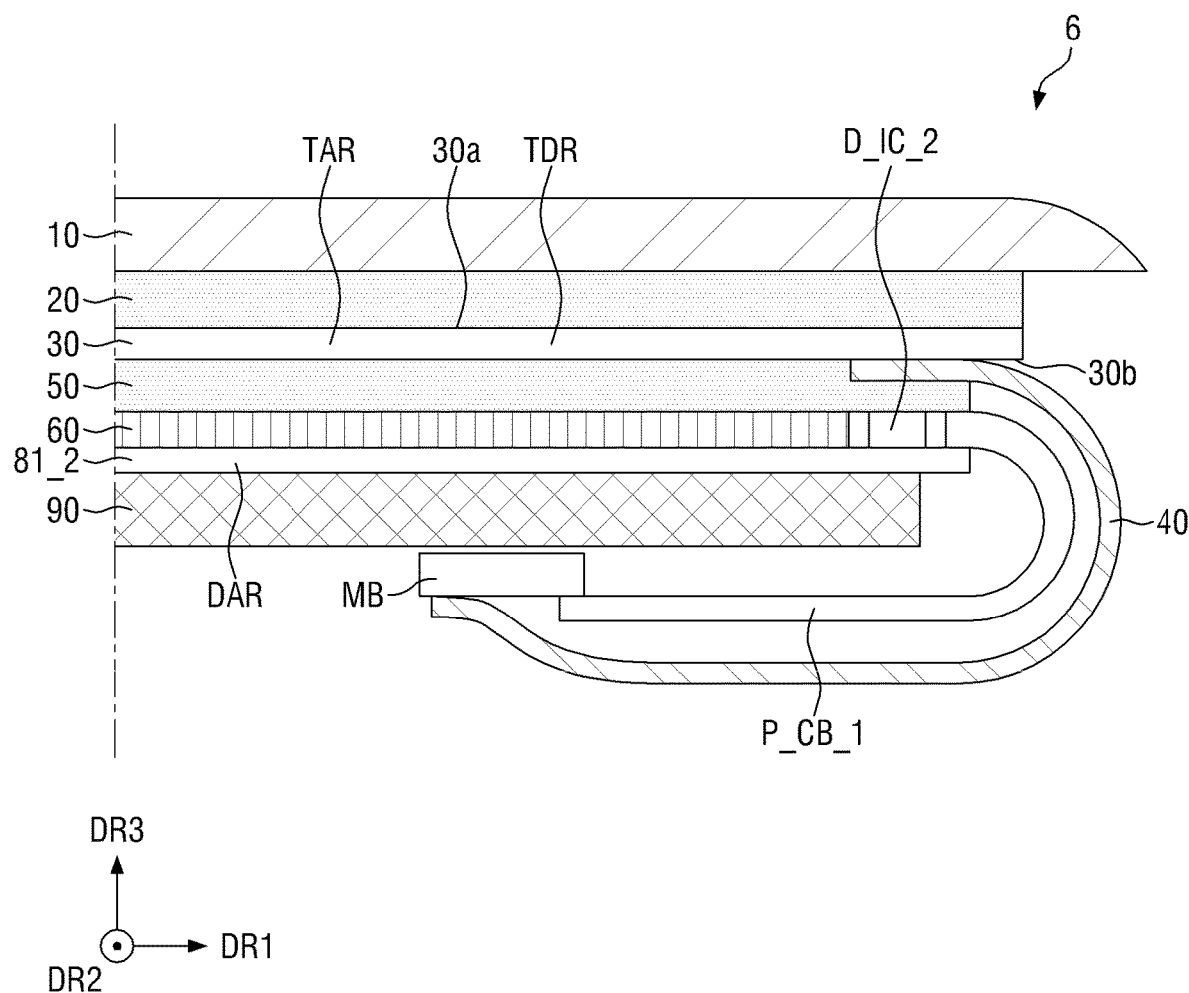
FIG. 18 is a cross-sectional view of a display device according to some exemplary embodiments.

FIG. 18 is a cross-sectional view of a display device according to some exemplary embodiments.

A display device 6 according to some exemplary embodiments is different from the display device 1 in that the display panel is not bent, but is flat. For instance, the driving area DDR of the display panel may be extended outwardly and may maintain the same flatness as the display area DAR. A substrate 81_2 of the display panel may be a rigid substrate, such as a glass substrate. It is, however, contemplated that exemplary embodiments are not limited thereto. The substrate 81_2 may be made of a flexible plastic material, such as polyimide, and may still maintain the flatness without being bent in the driving area DDR.

The driver chip D_IC_2 may be mounted on the driving area DDR of the display panel. The driver chip D_IC_2 may be located less to the outside than the side surface of the second transparent adhesive member 20, but exemplary embodiments are not limited thereto. Moreover, the driver chip D_IC_2 may be located less to the outside than the side surface of the first transparent adhesive member 50 and the side surface of the touch panel 30, but this is merely illustrative and exemplary embodiments are not limited thereto.

A display printed circuit board P_CB_1 may be attached on the outer side of the driver chip D_IC_2. The display printed circuit board P_CB_1 may be attached to one surface of the display panel by an anisotropic conductive film (ACF) or the like. The end of the display printed circuit board P_CB_1 attached to the display panel may be located less to the outside than the side surface of the first transparent adhesive member 50 and the side surface of the touch panel 30, as well as the side surface of the second transparent adhesive member 20.

The display printed circuit board P_CB_1 may be a flexible printed circuit board like the touch printed circuit board 40. The display printed circuit board P_CB_1 may be bent to surround the side surface of the display panel on its outer side, as shown in FIG. 18. The other end of the display printed circuit board P_CB_1 may be electrically connected to the main circuit board MB. The touch printed circuit board 40 may be bent to surround the display printed circuit board P_CB_1 on its outer side.

According to some exemplary embodiments, after the third contact portion CB3 of the touch printed circuit board 40 has been attached, the third contact portion CB3 of the touch printed circuit board 40 may be detached when it is bent due to tension. In this regard, the first transparent adhesive member 50 is disposed up to the third contact portion CB3 of the touch printed circuit board 40 to thereby prevent the third contact portion CB3 from being detached. In addition, by eliminating a space between the display panel and the touch printed circuit board 40, it is possible to protect the display device 6 from external impact. Further, by suppressing fluctuation of the display panel and the touch printed circuit board 40, it is possible to improve flatness of the display device 6.

In addition, the width of the protrusion PT of the first transparent adhesive member 50 in the second direction DR2 may be greater than the width of the third contact portion CB3 of the touch printed circuit board 40 in the second direction DR2. The protrusion PT of the first transparent adhesive member 50 may be in contact with the first touch protection layer 310 located on one side and the other side of the first touch signal lines 325 in the second direction DR2, and may cover the side surface of the third contact portion CB3 of the touch printed circuit board 40. The first transparent adhesive member 50 may be in contact with the first touch protection layer 310 located on one side and the other side of the first touch signal lines 325 in the second direction DR2. By doing so, it is possible to further suppress the fluctuation of the third contact portion CB3 of the touch printed circuit board 40.

Further, the first transparent adhesive member 50 is disposed on the two paths that would otherwise allow the corrosion promoting ions CPI of the polarizing film 65 to move to the third touch signal pads T_PAD3 and the third touch lead lines LE3 so that it is possible to prevent the corrosion promoting ions CPI from eroding the third touch signal pads T_PAD3 and the third touch lead lines LE3 or at least to slow down the corrosion. In this manner, it is possible to prevent line cracking and/or line disconnection due to corrosion of the third touch signal pads T_PAD3 and the third touch lead lines LE3.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising:
   a touch panel comprising:
      a sensing portion; and
      a pad side portion disposed on a side of the sensing portion;
   a transparent adhesive member disposed on a surface of the touch panel;
   a touch printed circuit board comprising a contact portion attached to a surface of the pad side portion; and
   a display panel disposed on a surface of the transparent adhesive member, wherein the display panel comprises:
  a display substrate;
  an optical film disposed on a surface of the display substrate; and
  a bending protection layer disposed on a side of the optical film on the surface of the display substrate,
wherein the surface of the pad side portion comprises:
  a connection area attached to the contact portion; and
  a non-connection area not attached to the contact portion, and
wherein:
  the optical film is spaced apart from the bending protection layer such that a gap is disposed between the optical film and the bending protection layer;
  the transparent adhesive member overlaps, in a thickness direction, with the touch printed circuit board and the gap;
  the transparent adhesive member is disposed between the display panel and the touch panel; and
  the transparent adhesive member directly contacts the touch printed circuit board.

2. The display device of claim 1, wherein:
a first portion of the transparent adhesive member is disposed on the connection area;
the first portion of the transparent adhesive member comprises a first protrusion protruding from a second portion of the transparent adhesive member, the second portion of the transparent adhesive member being disposed on the non-connection area;
the first protrusion overlaps, in the thickness direction, with the contact portion and the gap; and
the first protrusion is attached to the contact portion.

3. The display device of claim 2, wherein:
the optical film comprises:
  a first protection film;
  a polarizing film disposed on the first protection film; and
  a second protection film disposed on the polarizing film;
the second protection film is attached to the transparent adhesive member; and
the polarizing layer comprises corrosion promoting ions.

4. The display device of claim 3, wherein the corrosion promoting ions comprise iodine ions.

5. The display device of claim 3, wherein:
the touch panel comprises:
  touch pads disposed in the connection area; and
  a solder resist layer disposed on the touch pads and exposing the touch pads; and
the exposed touch pads overlap, in the thickness direction, with the transparent adhesive member.

6. The display device of claim 5, wherein:
the touch pads are arranged along a first direction;
a width of the first protrusion in the first direction is greater than a width of the contact portion in the first direction; and
wherein the transparent adhesive member is in contact with the solder resist layer on the non-connection area and covers a side surface of the contact portion.

7. The display device of claim 2, wherein a thickness of the first portion of the transparent adhesive member is smaller than a thickness of the second portion of the transparent adhesive member.

8. The display device of claim 7, wherein the first protrusion overlaps, in the thickness direction, with the non-connection area.

9. The display device of claim 7, wherein:
the first transparent adhesive member comprises:
  a second protrusion disposed on a first side of the first protrusion; and
  a third protrusion disposed on a second side of the first protrusion, the second side of the first protrusion opposing the first side of the first protrusion; and
the first, second, and third protrusions are spaced apart from one another.

10. The display device of claim 1, wherein:
the display panel comprises:
  a display area; and
  a driving area disposed on a side of the display area;
the sensing portion overlaps, in the thickness direction, with the display area; and
the pad side portion overlaps, in the thickness direction, with the driving area.

11. The display device of claim 10, wherein:
the display substrate is a flexible substrate; and
a portion of the flexible substrate associated with the driving area is bent away from a second portion of the flexible substrate associated with the display area.

12. The display device of claim 11, further comprising:
a display printed circuit board attached to the driving area; and
a main circuit board electrically connected to the touch printed circuit board and the display printed circuit board.

13. A display device comprising:
a touch panel comprising a pad side portion;
a first transparent adhesive member disposed on a first surface of the touch panel;
a printed circuit board comprising a first contact portion attached to a surface of the pad side portion;
a display panel disposed on a surface of the first transparent adhesive member, the display panel comprising:
  a display substrate;
  an optical film disposed on a surface of the display substrate; and
  a bending protection layer disposed on a side of the optical film on the surface of the display substrate;
a second transparent adhesive member disposed on a second surface of the touch panel, the second surface opposing the first surface; and
a window disposed on the second transparent adhesive member,
wherein the surface of the pad side portion comprises:
  a first connection area attached to the first contact portion; and
  a first non-connection area not attached to the first contact portion, and
wherein:
  the optical film is spaced apart from the bending protection layer such that a gap is disposed between the optical film and the bending protection layer;
  the first transparent adhesive member partially overlaps, in a thickness direction, with the optical film, the bending protection layer, and the printed circuit board;
  a side surface of the second transparent adhesive member on the first connection area protrudes beyond a side surface of the first transparent adhesive member;
  the first transparent adhesive member is disposed between the display panel and the touch panel; and
  the first transparent adhesive member directly contacts the printed circuit board.

14. The display device of claim 13, wherein:
a first portion of the first transparent adhesive member is disposed on the first connection area;
the first portion of the first transparent adhesive member comprises a first protrusion protruding from a second portion of the first transparent adhesive member, the second portion of the first transparent adhesive member being disposed on the first non-connection area;
the first protrusion overlaps, in the thickness direction, with the optical film, the bending protection layer, and the first contact portion of the print circuit board; and
the first protrusion is attached to the first contact portion.

15. The display device of claim 14, wherein:
the optical film comprises:
    a first protection film;
    a polarizing layer disposed on the first protection film; and
a second protection film disposed on the polarizing layer;
the second protection film is attached to the first transparent adhesive member; and
the polarizing layer comprises corrosion promoting ions.

16. The display device of claim 15, wherein:
the touch panel comprises:
    touch pads disposed in the connection area; and
    a solder resist layer disposed on the touch pads and exposing the touch pads; and
the exposed touch pads overlap, in the thickness direction, with the first transparent adhesive member.

17. The display device of claim 13, wherein a side surface of the first transparent adhesive member is aligned with a side surface of the second transparent adhesive member on the first non-connection area.

18. The display device of claim 17, wherein side surfaces of the first transparent adhesive member are aligned with side surfaces of the second transparent adhesive member on other side portions of the touch panel than the pad side portion.

19. The display device of claim 13, wherein:
the printed circuit board further comprises a second contact portion attached to the pad side portion of the second surface of the touch panel; and
the pad side portion on the second surface of the touch panel comprises:
    a second connection area attached to the second contact portion; and
    a second non-connection area not attached to the second contact portion.

20. The display device of claim 19, wherein:
a side surface of the second transparent adhesive member protrudes beyond a side surface of the first transparent adhesive member on the second connection area; and
a protruding portion of the second transparent adhesive member partially covers the second contact portion.

* * * * *